(12) United States Patent
Hirose

(10) Patent No.: US 7,791,012 B2
(45) Date of Patent: Sep. 7, 2010

(54) SEMICONDUCTOR DEVICE COMPRISING PHOTOELECTRIC CONVERSION ELEMENT AND HIGH-POTENTIAL AND LOW-POTENTIAL ELECTRODES

(75) Inventor: Atsushi Hirose, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 11/898,834

(22) Filed: Sep. 17, 2007

(65) Prior Publication Data

US 2008/0078923 A1 Apr. 3, 2008

(30) Foreign Application Priority Data

Sep. 29, 2006 (JP) ............................. 2006-268854

(51) Int. Cl.
*H01L 31/00* (2006.01)
(52) U.S. Cl. .......... 250/214.1; 250/208.1; 250/214 DC; 257/72; 257/432; 257/257
(58) Field of Classification Search .............. 250/214.1, 250/214 R, 208.1, 214 DC; 257/428, 432, 257/66, 72, 257
See application file for complete search history.

(56) References Cited

U.S. PATENT DOCUMENTS

| | | | |
|---|---|---|---|
| 4,862,237 A | 8/1989 | Morozumi | |
| 5,043,784 A | 8/1991 | Yamamoto et al. | |
| 5,198,660 A | 3/1993 | Yokoyama et al. | |
| 5,233,180 A | 8/1993 | Tsuruta et al. | |
| 5,936,231 A | 8/1999 | Michiyama et al. | |
| 5,981,936 A | 11/1999 | Fujiie | |
| 6,183,131 B1 | 2/2001 | Holloway et al. | |
| 6,287,888 B1 | 9/2001 | Sakakura et al. | |
| 6,531,711 B2 | 3/2003 | Sakakura et al. | |
| 6,674,185 B2 | 1/2004 | Mizuta | |
| 6,797,550 B2 | 9/2004 | Kokubo et al. | |
| 6,888,397 B2 | 5/2005 | Tsuchiya | |
| 6,911,358 B2 | 6/2005 | Azami et al. | |

(Continued)

FOREIGN PATENT DOCUMENTS

EP 0 445 757 9/1991

(Continued)

*Primary Examiner*—Thanh X Luu
*Assistant Examiner*—Francis M Legasse, Jr.
(74) *Attorney, Agent, or Firm*—Eric J. Robinson; Robinson Intellectual Property Law Office, P.C.

(57) ABSTRACT

To suppress a decrease in photosensitivity of a photoelectric conversion element provided in a semiconductor device by reducing the parasitic resistance of an amplifier circuit. In addition, the amplifier circuit which amplifies the output current of the photoelectric conversion element is operated stably. A semiconductor device includes a photoelectric conversion element, a current mirror circuit having at least two thin film transistors, a high-potential power supply electrically connected to each of the thin film transistors, and a low-potential power supply electrically connected to each of the thin film transistors. When a reference thin film transistor is an n-type, the reference thin film transistor is placed closer to the low-potential power supply than an output thin film transistor is. When a reference thin film transistor is a p-type, the reference thin film transistor is placed closer to the high-potential power supply than an output thin film transistor is.

12 Claims, 33 Drawing Sheets

U.S. PATENT DOCUMENTS

| | | |
|---|---|---|
| 6,930,326 B2 | 8/2005 | Kato et al. |
| 7,002,881 B2 | 2/2006 | Okuda et al. |
| 7,030,551 B2 | 4/2006 | Yamazaki et al. |
| 7,042,432 B2 | 5/2006 | Yamazaki et al. |
| 7,193,619 B2 | 3/2007 | Kimura |
| 7,253,391 B2 | 8/2007 | Koyama et al. |
| 2003/0230750 A1 | 12/2003 | Koyama et al. |
| 2004/0042707 A1 | 3/2004 | Imai et al. |
| 2005/0030518 A1 | 2/2005 | Nishi et al. |
| 2005/0056842 A1 | 3/2005 | Nishi et al. |
| 2005/0116310 A1 | 6/2005 | Nishi et al. |
| 2005/0167573 A1 | 8/2005 | Maruyama et al. |
| 2006/0163577 A1 | 7/2006 | Yamazaki et al. |
| 2006/0186497 A1* | 8/2006 | Nishi et al. ............. 257/428 |
| 2006/0261253 A1* | 11/2006 | Arao et al. ............. 250/214.1 |
| 2007/0045672 A1 | 3/2007 | Nishi et al. |
| 2007/0113886 A1 | 5/2007 | Arao et al. |
| 2007/0178945 A1* | 8/2007 | Cook et al. ............. 455/572 |
| 2007/0215869 A1 | 9/2007 | Moriya et al. |
| 2007/0229228 A1 | 10/2007 | Yamazaki et al. |
| 2007/0229279 A1 | 10/2007 | Yamazaki et al. |
| 2007/0229281 A1 | 10/2007 | Shionoiri et al. |
| 2007/0278998 A1 | 12/2007 | Koyama |
| 2007/0285225 A1 | 12/2007 | Koyama et al. |
| 2007/0285246 A1 | 12/2007 | Koyama |
| 2008/0055047 A1 | 3/2008 | Osada et al. |
| 2008/0055279 A1 | 3/2008 | Osada et al. |
| 2008/0058029 A1 | 3/2008 | Sato et al. |
| 2008/0060422 A1 | 3/2008 | Hosoya |
| 2008/0174494 A1 | 7/2008 | Suzuki et al. |
| 2008/0210762 A1 | 9/2008 | Osada et al. |

FOREIGN PATENT DOCUMENTS

| | | |
|---|---|---|
| JP | 60-020655 | 2/1985 |
| JP | 60-241260 | 11/1985 |
| JP | 63-269570 | 11/1988 |
| JP | 03-268369 | 11/1991 |
| JP | 04-268816 | 9/1992 |
| JP | 05-167056 | 7/1993 |
| JP | 06-037558 | 2/1994 |
| JP | 3444093 | 9/2003 |
| JP | 2003-315149 | 11/2003 |
| JP | 2005-167157 | 6/2005 |
| WO | WO 2005/114749 | 12/2005 |

* cited by examiner

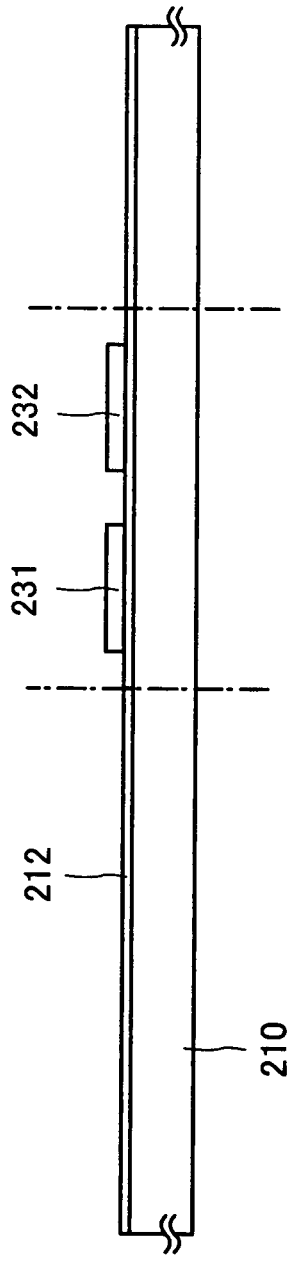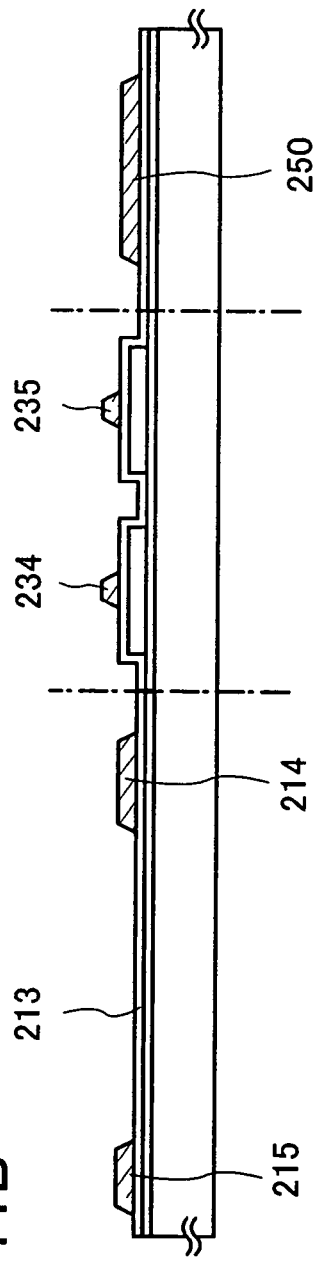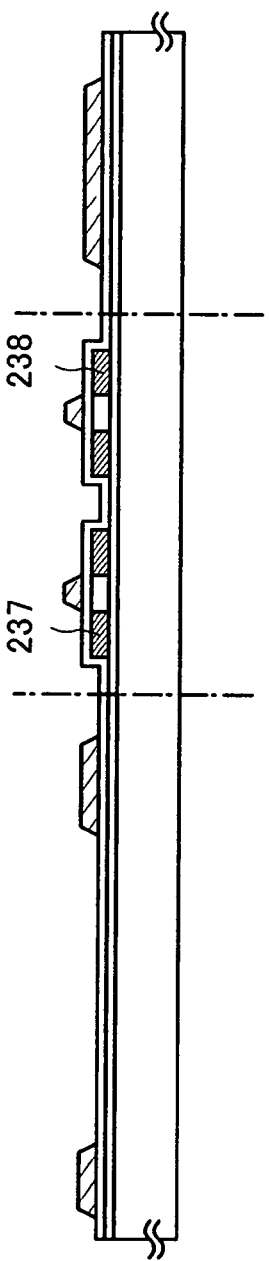

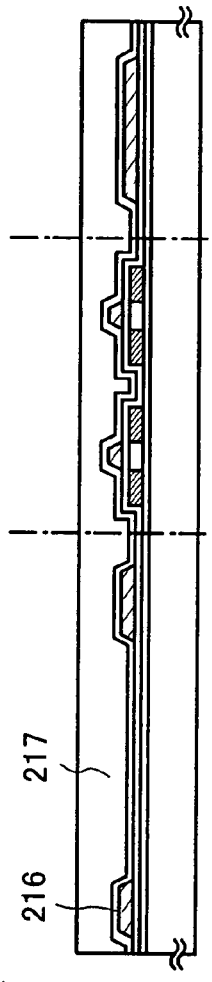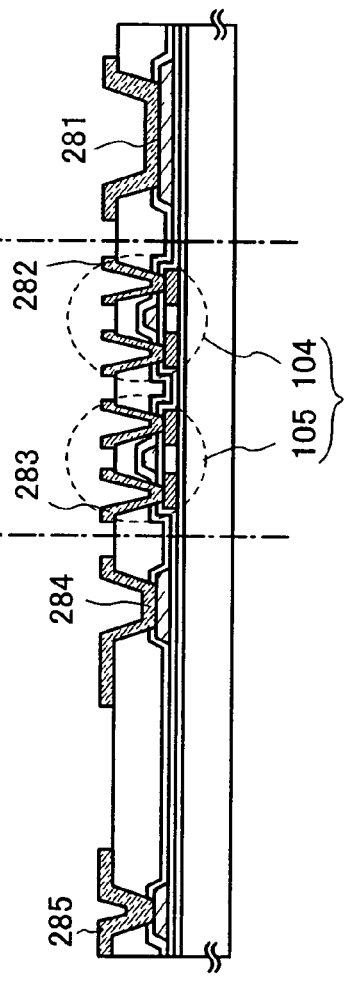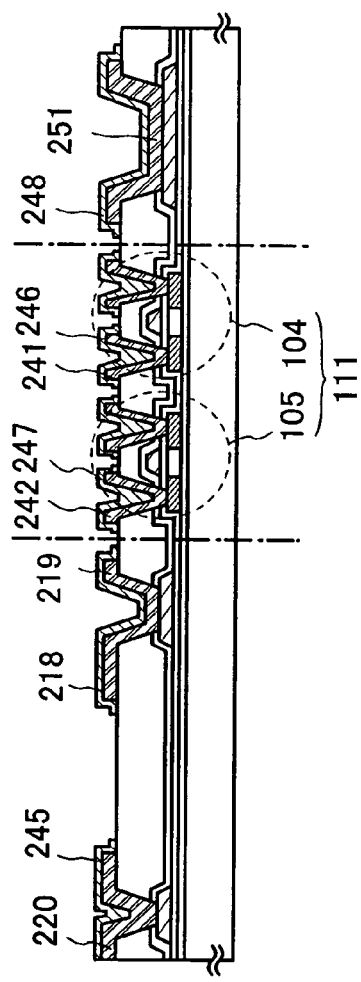
FIG. 12A
FIG. 12B
FIG. 12C light

SEMICONDUCTOR DEVICE COMPRISING PHOTOELECTRIC CONVERSION ELEMENT AND HIGH-POTENTIAL AND LOW-POTENTIAL ELECTRODES

BACKGROUND OF THE INVENTION

1. Field of the Invention

The present invention relates to photoelectric conversion devices and semiconductor devices having the same. In particular, the invention relates to a photoelectric conversion device having thin film semiconductor elements and a method of fabricating the same. Further, the invention also relates to an electronic device having such a photoelectric conversion device.

2. Description of the Related Art

There are known numerous photoelectric conversion devices that are used generally for detection of electromagnetic waves. For example, photoelectric conversion devices that detect ultraviolet rays to infrared rays are collectively referred to as photosensors. Among them, photosensors that detect visible light in the wavelength range of 400 to 700 nm are particularly referred to as visible light sensors. Many of such visible light sensors are used for devices whose illuminance and on/off switching need to be controlled in accordance with the living environment of humans.

In particular, a photosensor used for a display device detects the surrounding luminance of the display device and controls the luminance to be displayed on a panel. This is in order to reduce excess power consumption by detecting the surrounding luminance and determining an appropriate luminance to be displayed on the panel. Such a photosensor used for controlling luminance is applied to mobile phones or personal computers, for example.

Further, such a photosensor detects not only the surrounding luminance but also the luminance of a backlight of a display device, in particular, a liquid crystal display device, so that the luminance of a display screen can be controlled.

In such a photosensor, a photodiode is used in a detection unit, and an output current of the photodiode is amplified with an amplifier circuit. As such an amplifier circuit, a current mirror circuit is used for instance (e.g., see Japanese Patent No. 3444093, U.S. Pat. No. 5,936,231). The amplifier circuit is constructed from thin film transistors (TFTs).

SUMMARY OF THE INVENTION

Many of conventional amplifier circuits have multi-stage configurations including a correction circuit, and thus require a high power supply voltage. In recent years, it has been necessary in constructing an electric circuit to secure a stable power supply voltage from the aspects of power saving, high performance, and the like.

However, the above-described amplifier circuit having TFTs, e.g., a current mirror circuit, has a problem in that parasitic resistance is generated by a conductive layer which forms a TFT, wiring resistance of a wire connected thereto, contact resistance, or the like.

Regarding the current mirror circuit, in particular, there is a possibility that generation of parasitic resistance in a reference TFT will result in a decrease in detection range of light intensity. This will be described below.

FIG. 3 is a circuit diagram of a semiconductor device including a conventional photodiode and an amplifier circuit. The semiconductor device shown in FIG. 3 has a power supply 1001, a photodiode 1003, and a current mirror circuit 1011 which includes a reference TFT 1004 and an output TFT 1005. Parasitic resistance 1006 is generated in the reference TFT 1004.

The resistance value of the parasitic resistance 1006 is given by R. The voltage $V_{gate}$ applied to gate electrodes of the TFTs 1004 and 1005 when the parasitic resistance 1006 is not generated is given by $V_1$. On the other hand, the voltage $V_{gate}$ applied to the gate electrodes of the TFTs 1004 and 1005 when the parasitic resistance 1006 is generated is given by $V_2$.

When the parasitic resistance 106 is generated, as shown in FIG. 4, the upper limit of $V_{gate}$ when the output current (photocurrent) is saturated becomes smaller by $\Delta V = R \times I$, and thus $V_{gate}$ changes from $V_1$ to $V_2$. The decrease in upper limit of $V_{gate}$ leads to a decrease in upper limit of photocurrent I. Further, the detection range of light intensity becomes narrow.

The photocurrent I is saturated at $I_1$ when $V_{gate}$ is $V_1$ whereas it is saturated at $I_2$ when $V_{gate}$ is $V_2$, and no more current flows through the circuit. The photocurrent I is proportional to the light intensity E as shown in FIG. 5. Therefore, when the photocurrent I is saturated at $I_2$, the maximum detectable range of light intensity E becomes as small as $L_2$, resulting in a decrease in sensitivity of the photoelectric conversion device.

In view of the foregoing problems, it is an object of the invention to suppress a decrease in sensitivity of a photoelectric conversion device by suppressing parasitic resistance generated in a reference TFT of a current mirror circuit and preventing drops in gate voltage of the reference TFT.

One aspect of the invention is a semiconductor device including a photoelectric conversion element, a current mirror circuit including a reference thin film transistor and an output thin film transistor, the current mirror circuit amplifying an output of the photoelectric conversion element, and a power supply including a high-potential electrode and a low-potential electrode. Both the reference thin film transistor and the output thin film transistor are n-type thin film transistors. One of source and drain electrodes of the reference thin film transistor is electrically connected to the high-potential electrode through the photoelectric conversion element. One of source and drain electrodes of the output thin film transistor is electrically connected to the high-potential electrode. The other of the source and drain electrodes of the reference thin film transistor is electrically connected to the low-potential electrode. The other of source and drain electrodes of the output thin film transistor is electrically connected to the low-potential electrode. The reference thin film transistor is placed closer to the low-potential electrode than the output thin film transistor is. A wire electrically connected to the reference thin film transistor and the low-potential electrode is shorter than a wire electrically connected to the output thin film transistor and the low-potential electrode. A current path between the reference thin film transistor and the low-potential electrode is shorter than a current path between the output thin film transistor and the low-potential electrode. A drop in gate voltage of the reference thin film transistor is suppressed.

Another aspect of the invention is a semiconductor device including a photoelectric conversion element, a current mirror circuit including a reference thin film transistor and an output thin film transistor, the current mirror circuit amplifying an output of the photoelectric conversion element, and a power supply including a high-potential electrode and a low-potential electrode. Both the reference thin film transistor and the output thin film transistor are p-type thin film transistors. One of source and drain electrodes of the reference thin film transistor is electrically connected to the high-potential electrode. One of source and drain electrodes of the output thin film transistor is electrically connected to the high-potential electrode. The other of the source and drain electrodes of the reference thin film transistor is electrically connected to the low-potential electrode through the photoelectric conversion element. The other of source and drain electrodes of the output thin film transistor is electrically connected to the low-potential electrode. The reference thin film transistor is placed closer to the high-potential electrode than the output thin film transistor is. A wire electrically connected to the reference thin film transistor and the high-potential electrode is shorter than a wire electrically connected to the output thin film transistor and the high-potential electrode. A current path between the reference thin film transistor and the high-potential electrode is shorter than a current path between the output thin film transistor and the high-potential electrode. A drop in gate voltage of the reference thin film transistor is suppressed.

Another aspect of the invention is a semiconductor device including a photoelectric conversion element, a current mirror circuit including a reference thin film transistor and a plurality of output thin film transistors, the current mirror circuit amplifying an output of the photoelectric conversion element, a power supply including a high-potential electrode and a low-potential electrode. Both the reference thin film transistor and the plurality of the output thin film transistors are n-type thin film transistors. One of source and drain electrodes of the reference thin film transistor is electrically connected to the high-potential electrode through the photoelectric conversion element. One of source and drain electrodes of the plurality of the output thin film transistors are electrically connected to the high-potential electrode. The other of the source and drain electrodes of the reference thin film transistor is electrically connected to the low-potential electrode. The other of source and drain electrodes of the plurality of the output thin film transistors are electrically connected to the low-potential electrode. The reference thin film transistor is placed closer to the low-potential electrode than each of the plurality of the output thin film transistor is. A wire electrically connected to the reference thin film transistor and the low-potential electrode is shorter than a wire electrically connected to each of the plurality of the output thin film transistor and the low-potential electrode. A current path between the reference thin film transistor and the low-potential electrode is shorter than a current path between each of the plurality of the output thin film transistors and the low-potential electrode. A drop in gate voltage of the reference thin film transistor is suppressed.

Another aspect of the invention is a semiconductor device including a photoelectric conversion element, a current mirror circuit including a reference thin film transistor and a plurality of output thin film transistors, the current mirror circuit amplifying an output of the photoelectric conversion element, a power supply including a high-potential electrode and a low-potential electrode. Both the reference thin film transistor and the plurality of the output thin film transistors are p-type thin film transistors. One of source and drain electrodes of the reference thin film transistor is electrically connected to the high-potential electrode. One of source and drain electrodes of the plurality of the output thin film transistor are electrically connected to the high-potential electrode. The other of the source and drain electrodes of the reference thin film transistor is electrically connected to the low-potential electrode through the photoelectric conversion element. The other of source and drain electrodes of the plurality of the output thin film transistor are electrically connected to the low-potential electrode. The reference thin film transistor is placed closer to the high-potential electrode than each of the plurality of the output thin film transistors is. A wire electrically connected to the reference thin film transistor and the high-potential electrode is shorter than a wire electrically connected to each of the plurality of the output thin film transistor and the high-potential electrode. A current path between the reference thin film transistor and the high-potential electrode is shorter than a current path between each of the plurality of the output thin film transistors and the high-potential electrode. A drop in gate voltage of the reference thin film transistor is suppressed.

Note that in this specification, the reference thin film transistor is placed as close as possible to the low-potential power supply within the allowable range of design rules.

Note also that in this specification, "semiconductor device" refers to a device having a semiconductor layer. Therefore, a device as a whole which includes an element having a semiconductor layer is called a semiconductor device.

According to the invention, a photoelectric conversion device in which a decrease in photosensitivity is suppressed can be provided. Further, since generation of parasitic resistance can be suppressed, stable circuit operation is ensured and products with high reliability can be provided.

BRIEF DESCRIPTION OF THE DRAWINGS

In the accompanying drawings:

FIGS. 11A to 11C are cross-sectional views illustrating the steps of fabricating a semiconductor device of the invention;

FIGS. 12A to 12C are cross-sectional views illustrating the steps of fabricating a semiconductor device of the invention;

DETAILED DESCRIPTION OF THE INVENTION

Embodiment Mode 1

Figure 1:
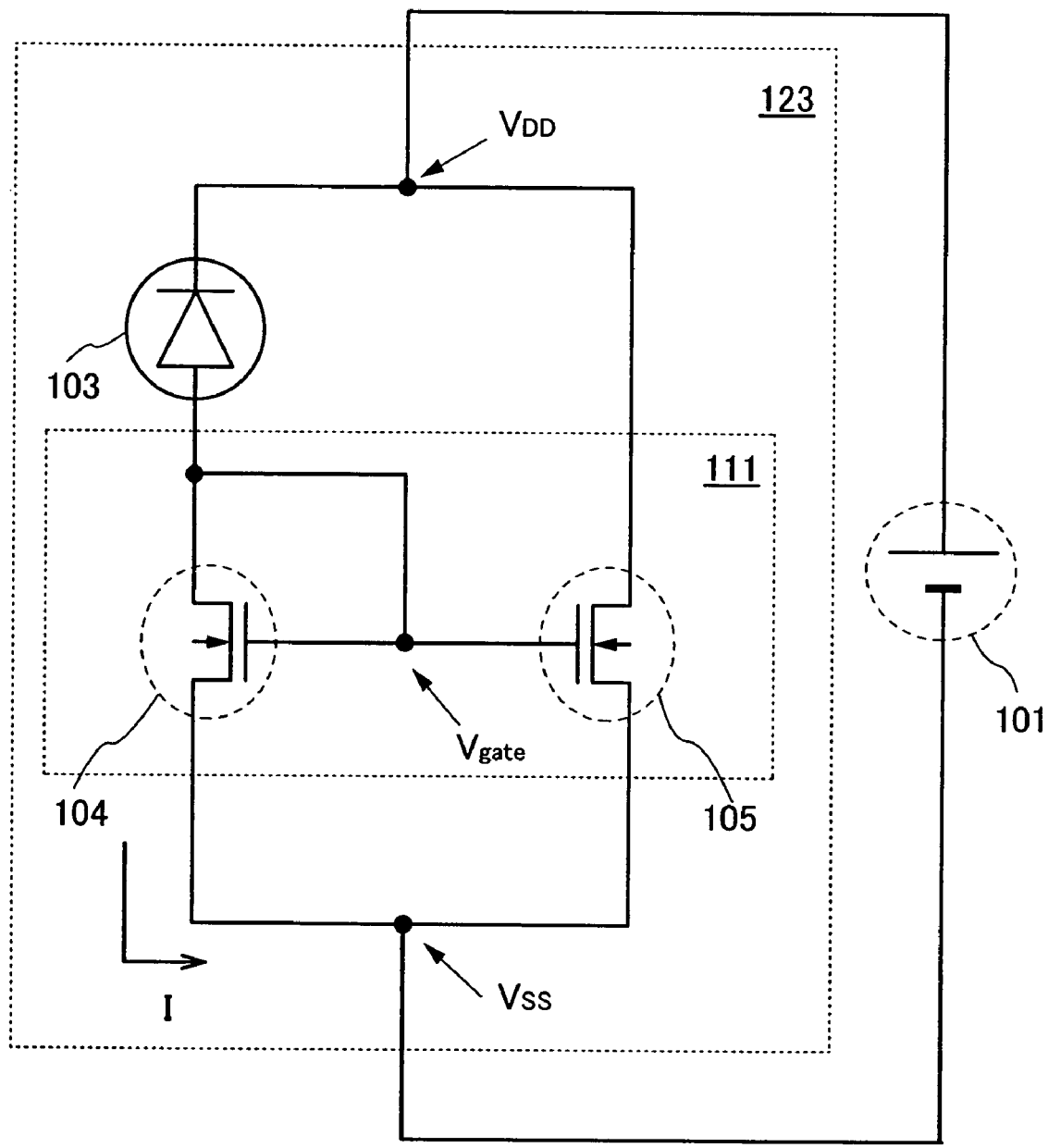
FIG. 1 is a circuit diagram of a semiconductor device of the invention.

Embodiment Mode 1 will be described below with reference to FIGS. 1 through 14C.

Note that the invention can be implemented in various different ways and it will be easily understood by those skilled in the art that various changes and modifications can be made in the invention without departing from the spirit and scope thereof. Therefore, the invention should not be construed as being limited to the description of the following embodiment modes.

Note also that in all the drawings illustrating embodiment modes, portions that are the same or portions having a similar function are denoted by the same reference numerals, and repetitive description thereof will be omitted.

A semiconductor device of this embodiment mode includes, as shown in FIG. 1, a current mirror circuit 111 having transistors 104 and 105 and a power supply (bias) 101. In this embodiment mode, thin film transistors (TFTs) are used as the transistors 104 and 105. In addition, the TFTs 104 and 105 are n-channel TFTs.

The current mirror circuit constructed from n-channel TFTs includes the reference TFT 104 and the output TFT 105 (see FIG. 1). Upon application of the same voltage to gates of the reference TFT 104 and the output TFT 105, a current flowing through the output TFT 105 is controlled in accordance with the current flowing through the reference TFT 104.

Figure 2:
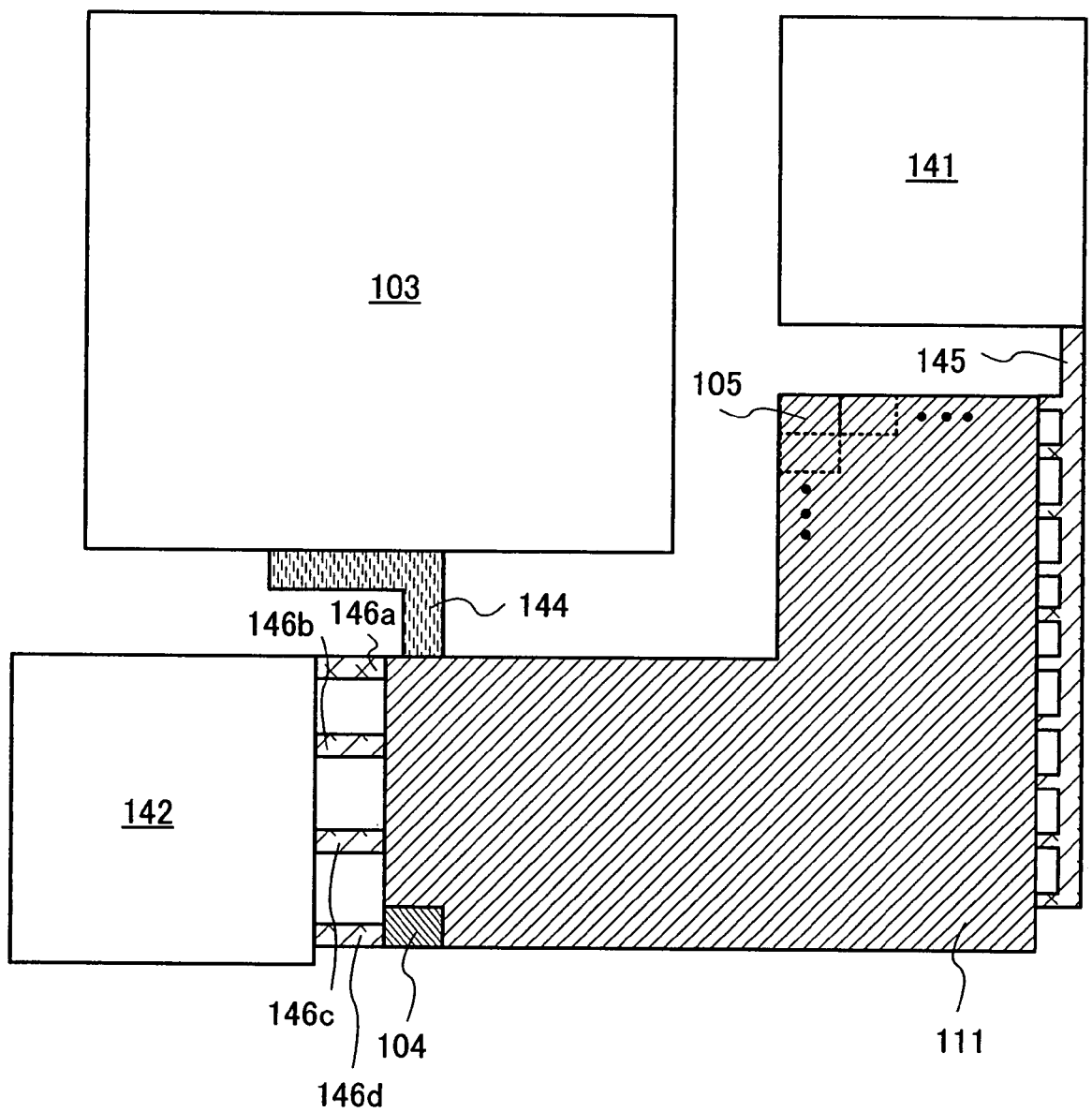
FIG. 2 is a block diagram of a semiconductor device of the invention.
Figure 3:
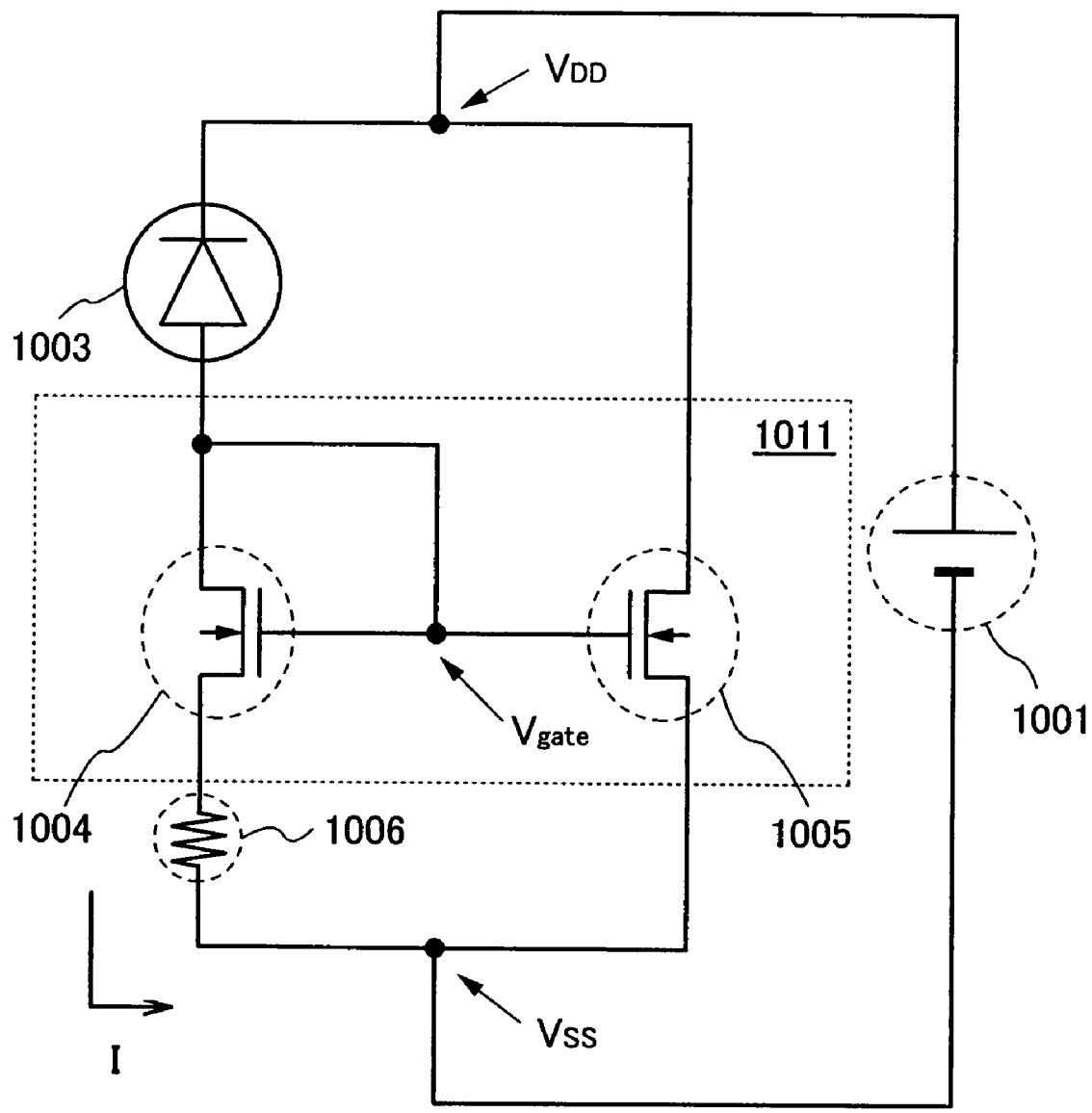
FIG. 3 is a circuit diagram of a semiconductor device.

FIG. 2 shows a block diagram. A semiconductor device shown in FIG. 2 includes a photodiode 103, the current mirror circuit 111 having the reference TFT 104 and the output TFT 105, an electrode (high-potential electrode) 141 for connection with a high-potential power supply ($V_{DD}$), an electrode (low-potential electrode) 142 for connection with a low-potential power supply ($V_{ss}$), a wire 144 for electrically connecting the photodiode 103 and the TFTs 104 and 105, a wire 145 for electrically connecting the TFTs 104 and 105 and the electrode 141, and wires 146 (e.g., wires 146a to 146d) for electrically connecting the TFTs 104 and 105 and the electrode 142. Although the number of the wires 146 (the wires 146a to 146d) shown in FIG. 2 is only four, the number may be determined as appropriate. In addition, the output TFT 105 includes a plurality of TFTs, and an output current (photocurrent) is amplified in accordance with the number of the TFTs.

Figure 26:
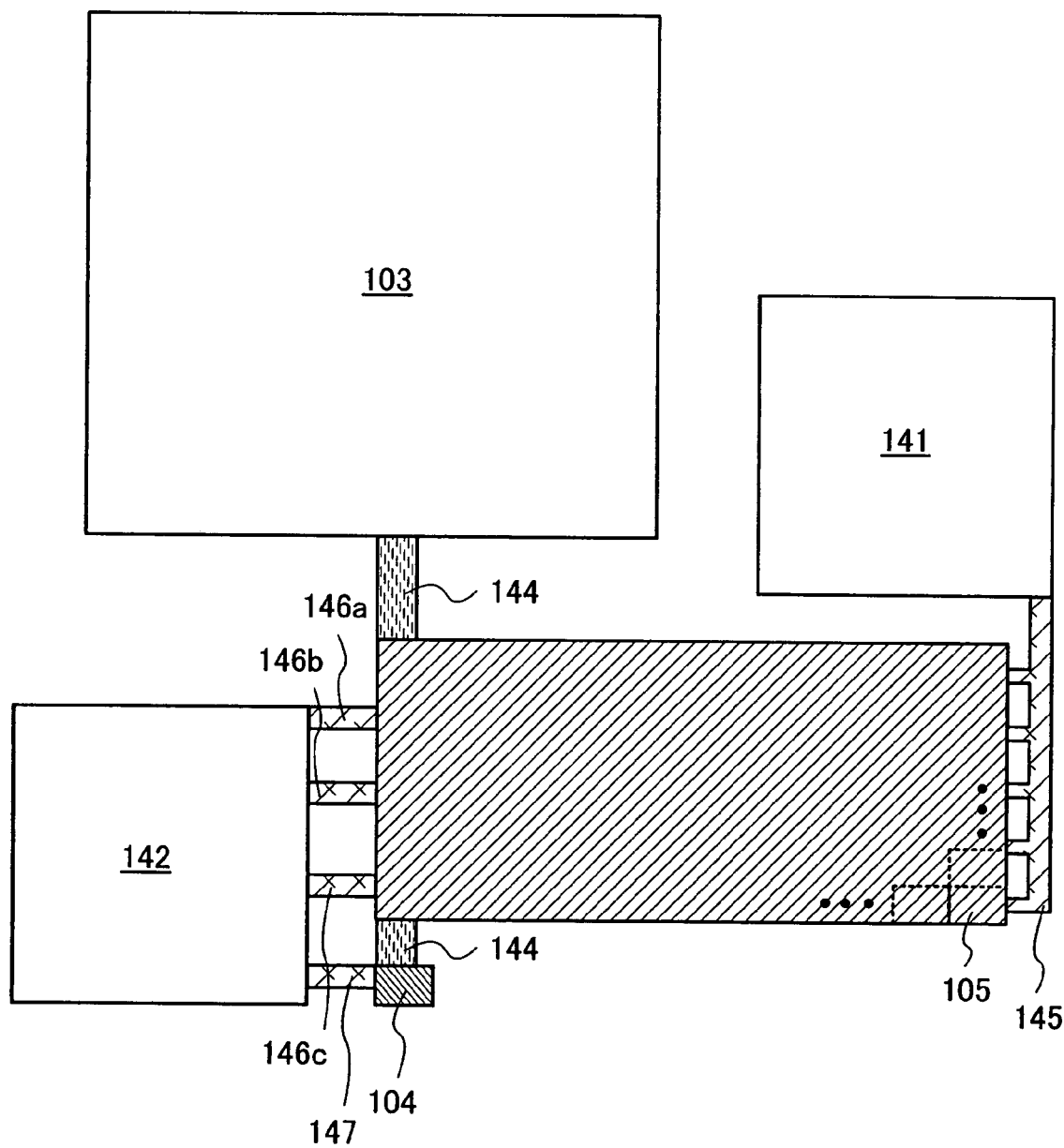
FIG. 26 is a block diagram of a semiconductor device of the invention.

Alternatively, as shown in FIG. 26, the reference TFT 104 may be formed separately from the output TFT 105. In that case, the reference TFT 104 may be electrically connected to the electrode 142 through a wire 147 which is different from the wires 146.

The reference TFT 104 is placed close to the electrode 142, so that the gate voltage $V_{gate}$ thereof will not drop by wiring resistance and the like.

The reference TFT 104 is placed closer to the electrode 142 than the output TFT 105 is, so that a drop in gate voltage $V_{gate}$ of the reference TFT 104 can be suppressed. A wire electrically connected to the reference TFT 104 and the electrode 142 is shorter than a wire electrically connected to the output TFT 105 and the electrode 142. A current path between the reference TFT 104 and the electrode 142 is shorter than a current path between the output TFT 105 and the electrode 105.

When parasitic resistance is generated in the reference TFT 104, the gate voltage $V_{gate}$ (the gate-source voltage $V_{gs}$) of the TFT 104 drops by the resistance value R of the parasitic resistance multiplied by the output current (photocurrent) I ($R \times I = \Delta V$).

Figure 4:
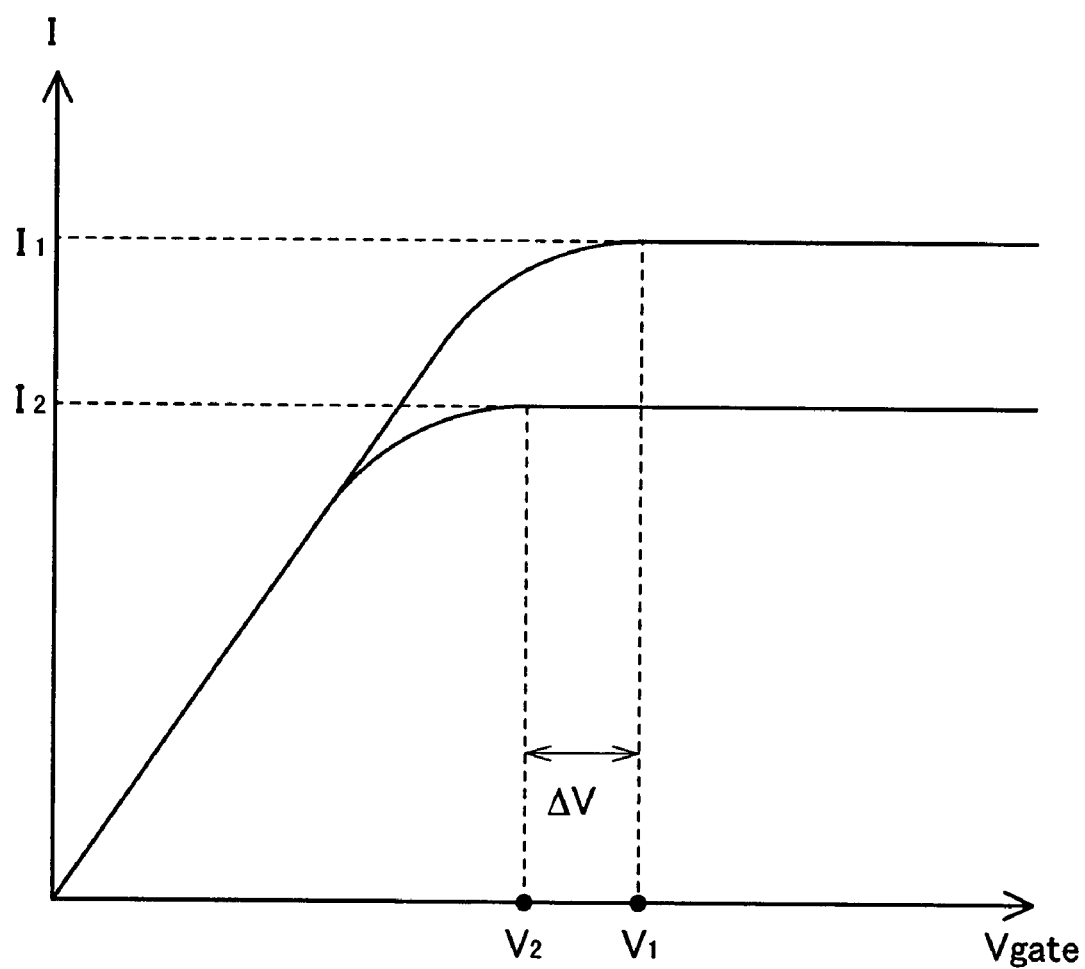
FIG. 4 illustrates the relationship between the gate voltage $V_{gate}$ and the photocurrent I.
Figure 5:
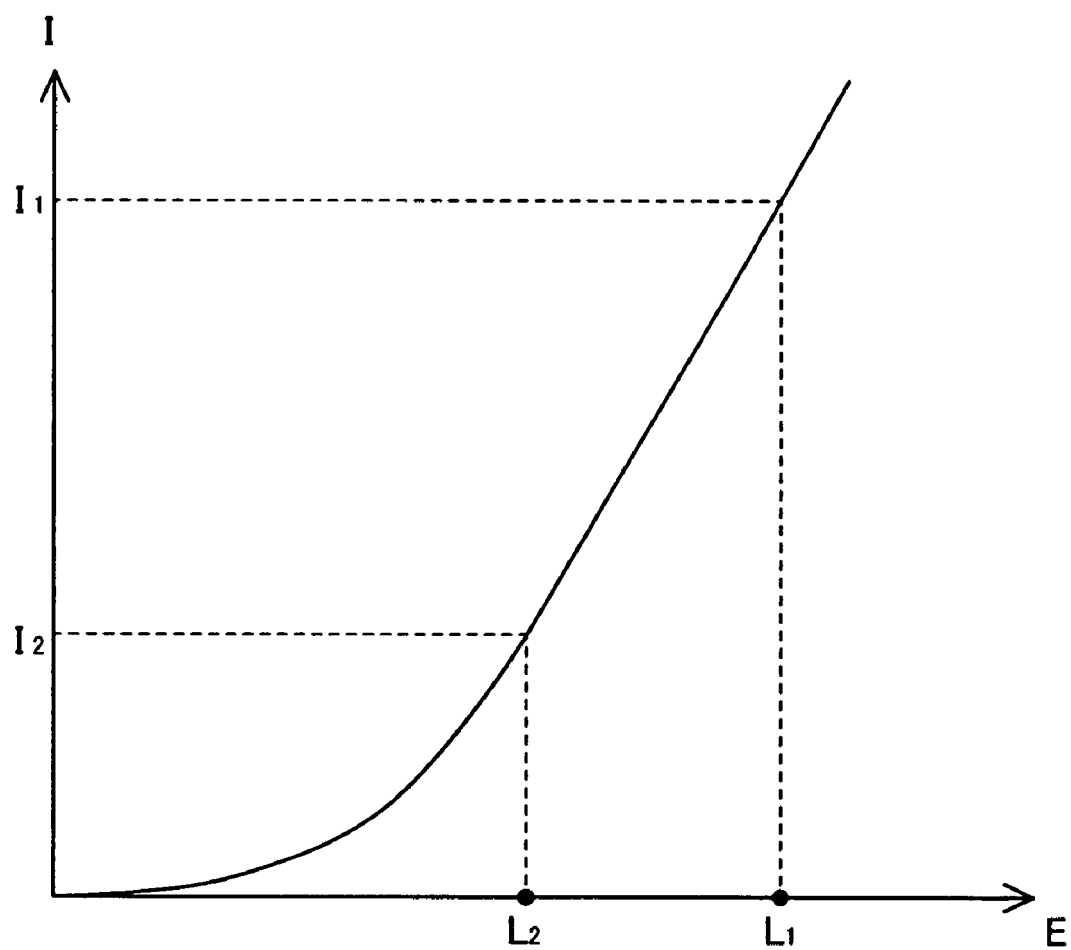
FIG. 5 illustrates the relationship between the illuminance E and the photocurrent I.

FIG. 4 illustrates the relationship between the gate voltage $V_{gate}$ of the TFT 104 and the output current (photocurrent) I, where the horizontal axis indicates the voltage $V_{gate}$ (a linear scale) and the vertical axis indicates the photocurrent I (a log scale). FIG. 5 illustrates the relationship between the illuminance E and the output current (photocurrent) I, where the horizontal axis indicates the illuminance E (a log scale) and the vertical axis indicates the photocurrent I (a log scale).

As shown in FIG. 4, when parasitic resistance is generated, $V_{gate}$ changes from $V_1$ ($V_{gate}$ when the parasitic resistance is the minimum) to $V_2$ ($V_1 - \Delta V$: $V_{gate}$ when the parasitic resistance is generated). The photocurrent I is saturated at $I_1$ when $V_{gate}$ is $V_1$ whereas it is saturated at $I_2$ when $V_{gate}$ is $V_2$, and no more current flows through the circuit. The photocurrent I is proportional to the light intensity E as shown in FIG. 5. Therefore, when the photocurrent I is saturated at $I_2$, the maximum detectable range of light intensity E becomes as small as $L_2$, resulting in a decrease in sensitivity of the photoelectric conversion device.

Note that it is in practice difficult to completely eliminate the parasitic resistance such as wiring resistance. Therefore, $V_1$ may not always be equal to $V_{gate}$ when the parasitic resistance is not generated.

However, in the invention, wiring resistance between the reference TFT 104 and the electrode 142 can be minimized since the reference TFT 104 is placed close to the electrode 142 for connection with a low-potential power supply ($V_{ss}$). Thus, generation of parasitic resistance can be suppressed to the minimum, and a decrease in sensitivity of the photoelectric conversion device can be suppressed.

In order to further reduce the wiring resistance, it is also possible to increase the width of a wire that electrically connects the TFT 104 and the electrode 142 or increase the thickness of a conductive film that forms the wire.

Figure 6:
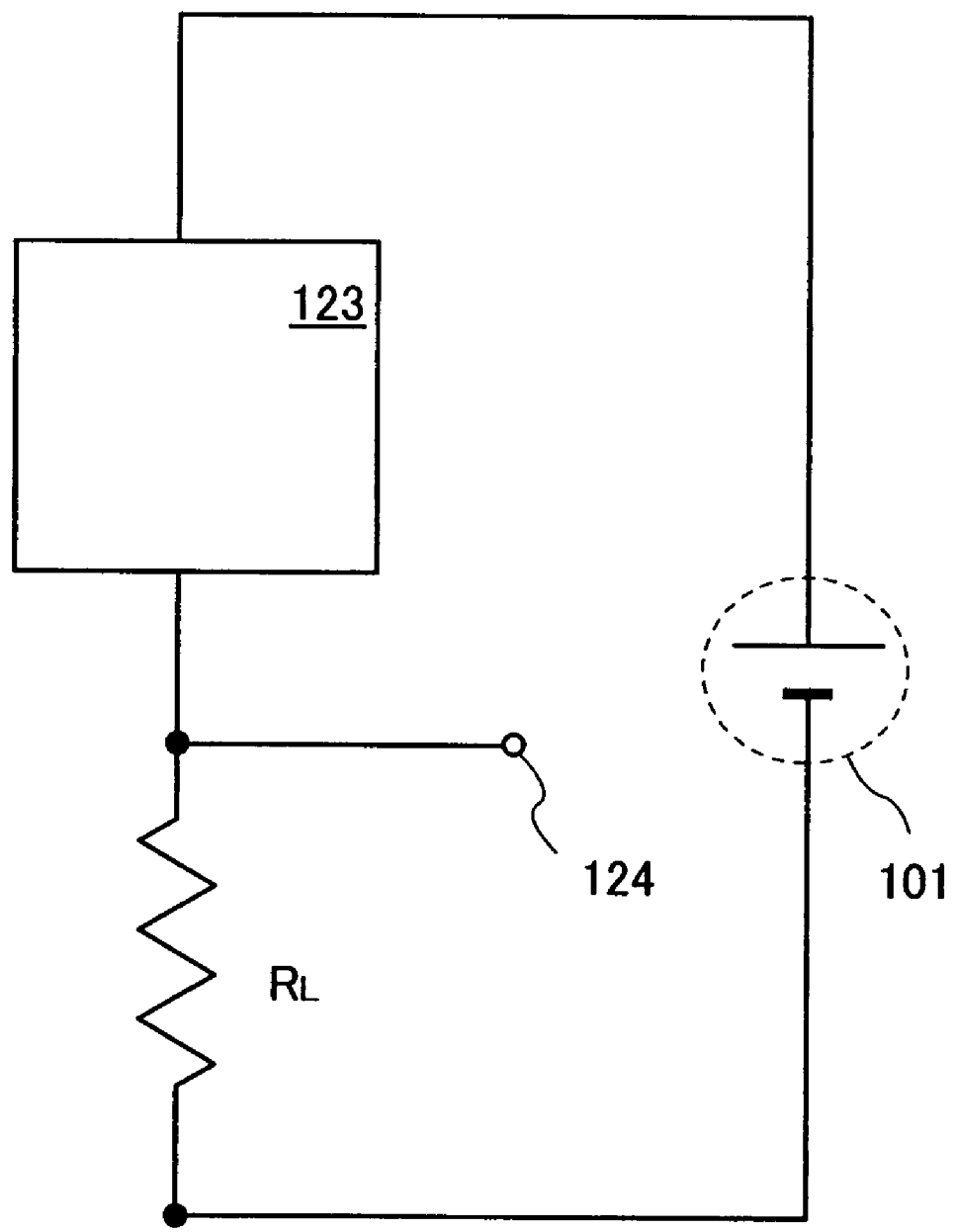
FIG. 6 is a circuit diagram of a semiconductor device of the invention.

As a method of obtaining a voltage signal as an output signal, which is generally regarded as an easy signal processing method, there is known a method of converting a current into a voltage using a load resistor $R_L$. Specifically, as shown in FIG. 6, in a circuit which includes a circuit 123 having the photodiode 103 and the current mirror circuit 111, the power supply 101, an output terminal 124, and a load resistor $R_L$, an output current is converted into a voltage with the use of the load resistor $R_L$, whereby a voltage signal can be output from the output terminal 124. The circuit of FIG. 6, in which the circuit 123 including the current mirror circuit 111 shown in FIG. 1 is built, will now be described.

In FIG. 1, the gate electrode of the TFT 104 which constitutes the current mirror circuit 111 is electrically connected to the gate electrode of the other TFT 105 which jointly constitutes the current mirror circuit 111 and also to a drain electrode (also referred to as a "drain terminal") of the TFT 104.

The drain terminal of the TFT 104 is electrically connected to a drain terminal of the TFT 105 through the photodiode 103.

A source electrode (also referred to as a "source terminal") of the TFT 104 is electrically connected to a source terminal of the TFT 105.

In this embodiment mode, the output terminal 124 of the circuit 123 including the current mirror circuit 111 is electrically connected to the low potential side of the power supply 101 through the load resistor $R_L$.

In FIG. 1, the gate electrode of the TFT 105 which constitutes the current mirror circuit 111 is electrically connected to the drain terminal of the TFT 104.

In addition, since the gate electrodes of the TFTs 104 and 105 are connected to each other, a common potential is applied thereto.

FIG. 1 illustrates an example of a current mirror circuit having two TFTs. Provided that the TFTs 104 and 105 have the same characteristics, the ratio of a reference current to an output current is 1:1.

Figure 7:
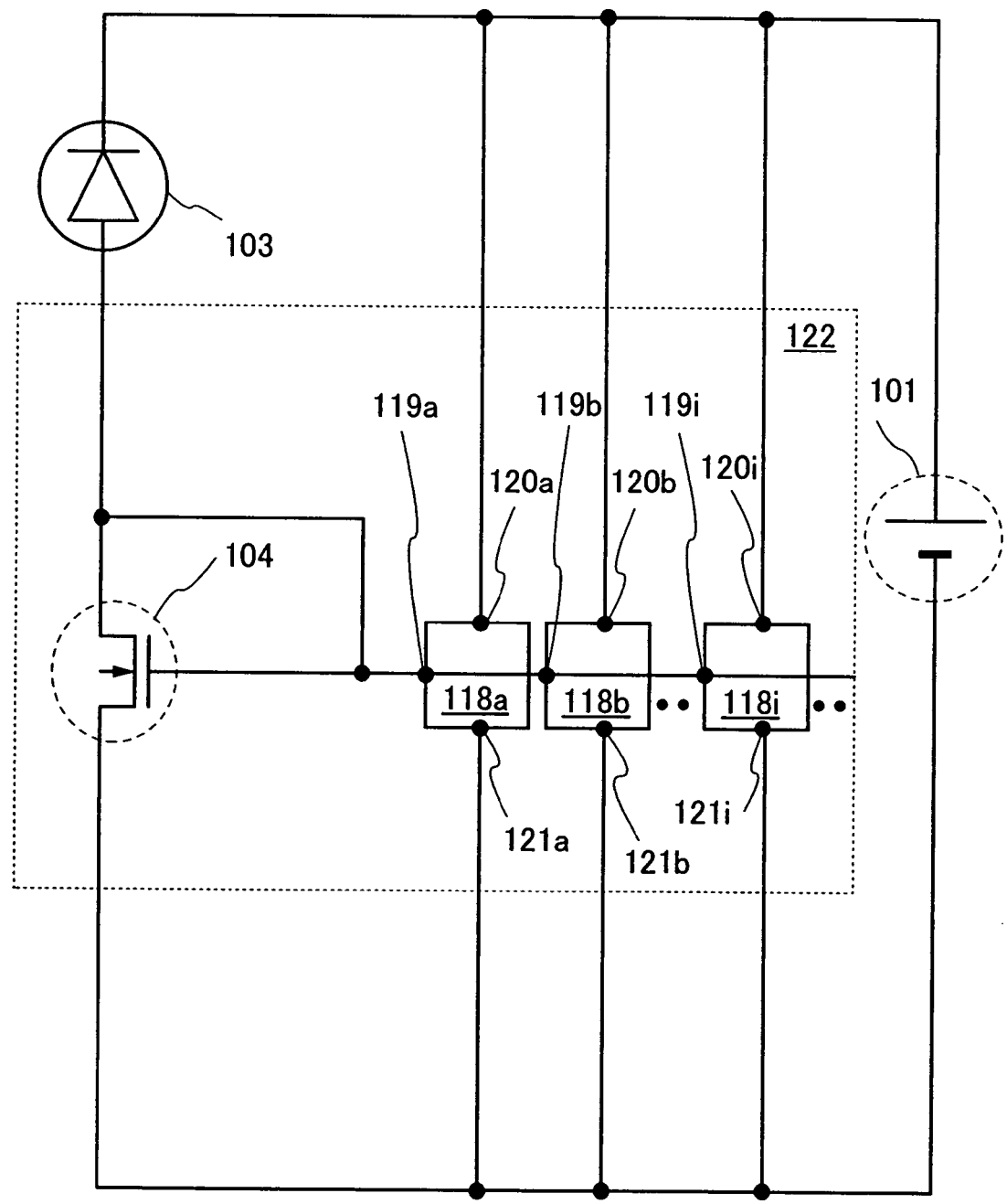
FIG. 7 is a circuit diagram of a semiconductor device of the invention.
Figure 8:
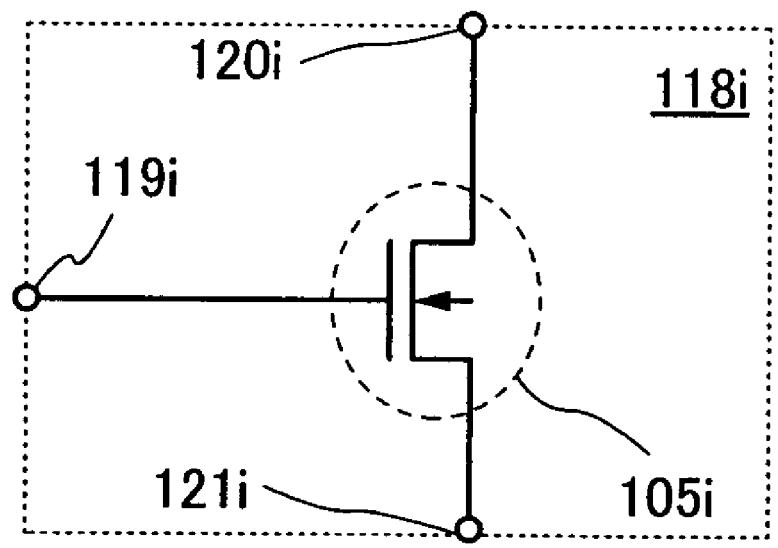
FIG. 8 is a circuit diagram of a semiconductor device of the invention.

FIGS. 7 and 8 illustrate circuit configurations with which an output value can be increased n times. The circuit configuration of FIG. 7 corresponds to the configuration of FIG. 1 in which n TFTs 105 are provided. When the ratio of the n-channel TFT 104 to the n-channel TFTs 105 is set at 1:n as shown in FIG. 7, the output value can be increased n times. This serves the same principle as a configuration in which the channel width W of a TFT is increased so as to increase the limit of a current flow through the TFT n times.

For example, in order to increase an output value 100 times as large, the desired current can be obtained by connecting one n-channel TFT 104 and 100 n-channel TFTs 105 in parallel.

FIG. 8 shows a specific circuit configuration of a circuit 118*i* (e.g., circuits 118*a*, 118*b*, and the like) shown in FIG. 7.

The circuit configuration of FIG. 8 is based on the circuit configurations of FIGS. 1 and 7, and components that are common to FIGS. 1, 7, and 8 are denoted by common reference numerals. A gate electrode of a TFT 105*i* is electrically connected to a terminal 119*i*, a drain terminal thereof is electrically connected to a terminal 120*i*, and a source terminal thereof is electrically connected to a terminal 121*i*.

For illustration purpose of the circuits 118*a*, 118*b*, and the like in FIG. 7, one of them, i.e., the circuit 118*i* is shown as a representative example in FIG. 8. Since the circuit 118*i* is based on the circuit configuration of FIG. 1, reference numerals with "i" in FIG. 8 denote the same components as those without "i" in FIG. 1. That is, the TFT 105 in FIG. 1 and the TFT 105*i* in FIG. 8, for example, are the same TFTs.

Therefore, the n-channel TFT 105 corresponds to n n-channel TFTs 105*a*, 105*b*, 105*i*, and the like in FIG. 7. Accordingly, a current flow through the TFT 104 can be amplified n times to be output.

Note that components that are common to FIGS. 1, 7, and 8 are denoted by common reference numerals.

In addition, although FIG. 1 illustrates an equivalent circuit of the current mirror circuit 111 having n-channel TFTs, the n-channel TFTs may be replaced with p-channel TFTs.

Figure 9:
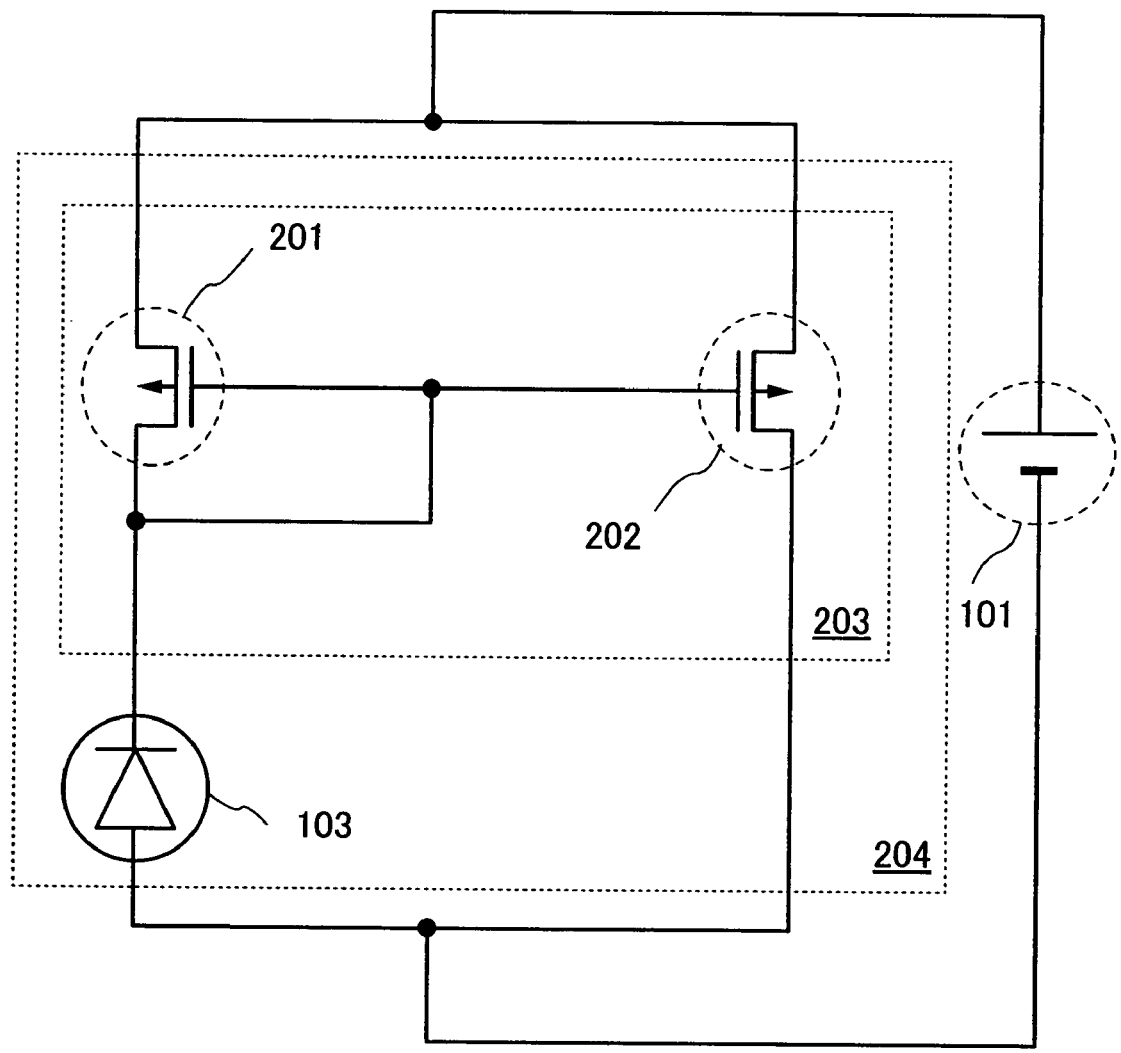
FIG. 9 is a circuit diagram of a semiconductor device of the invention.

When the amplifier circuit is constructed from p-channel TFTs, an equivalent circuit shown in FIG. 9 results. As shown in FIG. 9, a current mirror circuit 203 includes p-channel TFTs 201 and 202. The p-channel TFT 201 is placed closer to the high-potential electrode 141 than the p-channel TFT 202 is. A wire electrically connected to the p-channel TFT 201 and the electrode 141 is shorter than a wire electrically connected to the p-channel TFT 202 and the electrode 141. A current path between the p-channel TFT 201 and the electrode 141 is shorter than a current path between the p-channel TFT 202 and the electrode 141. Note that components common to FIGS. 1 and 9 are denoted by common reference numerals. In addition, in order to obtain a voltage output signal, a circuit 204 may be employed instead of the circuit 123 shown in FIG. 6.

Figure 10:
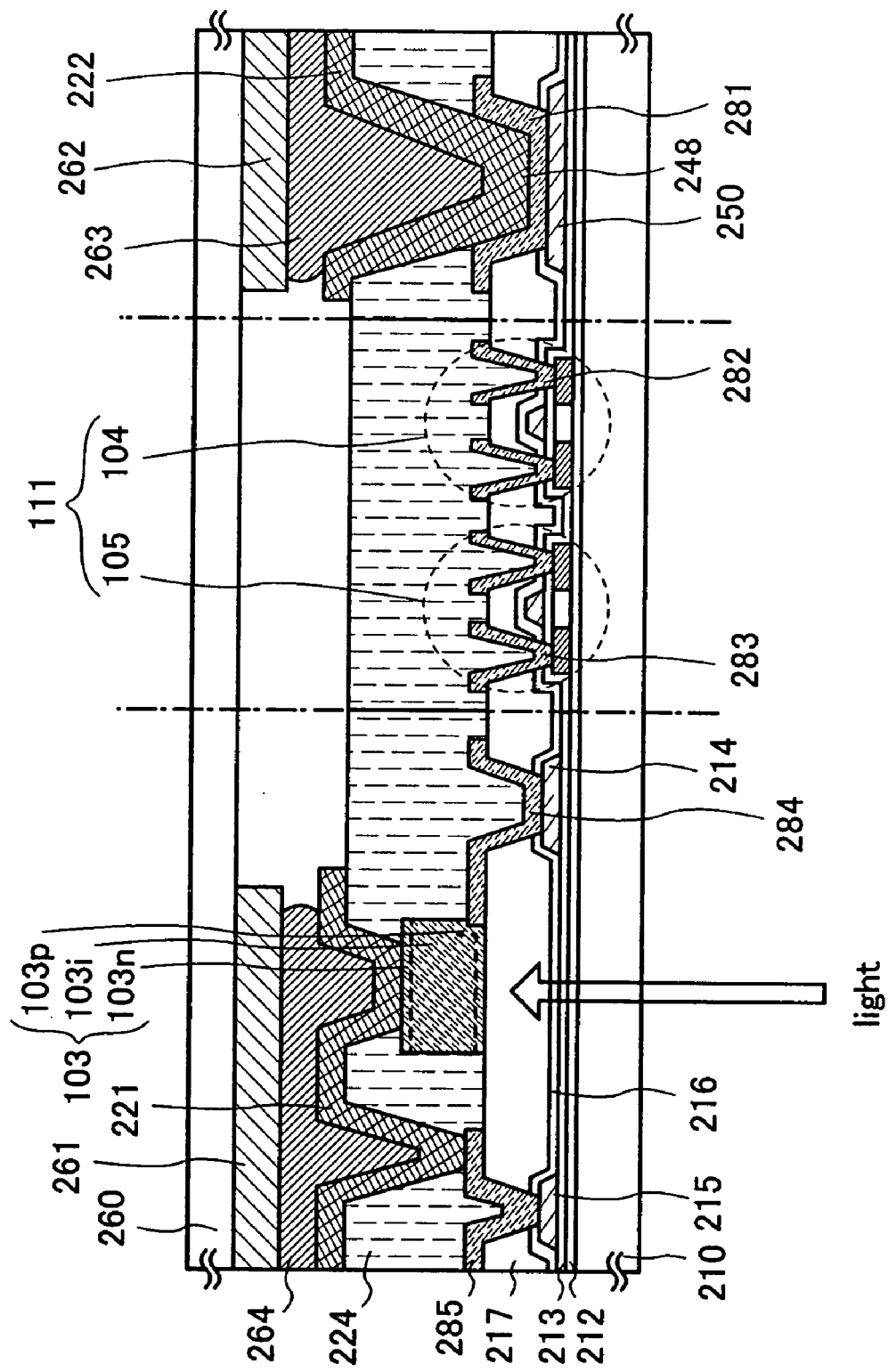
FIG. 10 is a cross-sectional view of a semiconductor device of the invention.

FIG. 10 illustrates a cross-sectional view of the circuit 123 shown in FIG. 1, which includes the current mirror circuit 111 having the TFTs 104 and 105 and the photodiode 103.

In FIG. 10, reference numerals 210, 212, and 213 denote a substrate, a base insulating film, and a gate insulating film, respectively.

In addition, a connection electrode 285, a terminal electrode 281, source and drain electrodes 282 of the TFT 104, and source and drain electrodes 283 of the TFT 105 have a stacked structure of a high-melting-point metal film and a low-resistance metal film (e.g., an aluminum alloy or pure aluminum). Here, each of the connection electrode 285, the terminal electrode 281, and the source and drain electrodes 282 and 283 is formed to have a three-layer structure in which a titanium (Ti) film, an aluminum (Al) film, and a Ti film are sequentially stacked.

Instead of the stacked structure of a high-melting-point metal film and a low-resistance metal film, it is also possible to use a single-layer conductive film. Examples of a single-layer conductive film include an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), or platinum; a single-layer film made of an alloy material or a compound material containing such an element as a main component; or a single-layer film made of nitride of such an element, e.g., titanium nitride, tungsten nitride, tantalum nitride, or molybdenum nitride.

Although the n-channel TFTs 104 and 105 shown in FIG. 10 are top-gate TFTs having one channel formation region (referred to as a "single-gate structure" in this specification), it is also possible to use a structure having a plurality of channel formation regions so as to reduce variations in on-current value.

Further, in order to reduce an off-current value, the n-channel TFTs 104 and 105 may be provided with lightly doped drain (LDD) regions. An LDD region refers to an impurity region provided between a channel formation region and a source or drain region, which is formed so as to contain an impurity element at a high concentration by doping. With the LDD region, an electric field in the vicinity of the drain region can be alleviated, whereby degradation of a TFT due to hot carrier injection can be prevented.

Further, in order to prevent a decrease in on-current value by hot carriers, it is also possible to form the n-channel TFTs 104 and 105 to have a structure in which an LDD region overlaps with a gate electrode with a gate insulating film interposed therebetween (referred to as a "GOLD (Gate-drain Overlapped LDD) structure" in this specification).

Using the GOLD structure has an advantageous effect in that an electric field in the vicinity of the drain region can be alleviated more than the case of not forming the LDD region so as to overlap with the gate electrode, and thus degradation of a TFT due to hot carrier injection can be prevented. With such a GOLD structure, electric field intensity in the vicinity of the drain region can be alleviated and hot carrier injection can be prevented, which is effective in preventing degradation of a TFT.

Further, not only top-gate TFTs, but also bottom-gate TFTs such as inversely staggered TFTs may be used for the TFTs 104 and 105 that constitute the current mirror circuit 111.

A wire 215 is electrically connected to a drain wire (also referred to as a drain electrode) or a source wire (also referred to as a source electrode) of the TFT 104. In addition, reference numerals 216 and 217 denote insulating films and reference numeral 285 denotes a connection electrode. Note that the insulating film 217 is preferably a silicon oxide film formed by a CVD method. When a silicon oxide film formed by a CVD method is used for the insulating film 217, fixing strength thereof can be increased.

A terminal electrode 250 is formed through the same steps as the wire 215, and the terminal electrode 281 is formed through the same steps as the connection electrode 285.

In addition, a terminal electrode 221 is mounted on an electrode 261 of a substrate 260 with a solder 264. Further, a terminal electrode 222 is formed through the same steps as the terminal electrode 221, and mounted on an electrode 262 of the substrate 260 with a solder 263.

The steps of fabricating the semiconductor device shown in FIG. 10, which includes the photodiode 103 and the current mirror circuit 111 having the TFTs 104 and 105, will be described with reference to FIGS. 10 through 13B.

First, elements are formed over a substrate (the first substrate 210). Here, AN 100 which is a glass substrate is used as the substrate 210.

Next, a silicon oxide film containing nitrogen is deposited as a base insulating film 212 (a thickness of 100 nm) by a plasma CVD method. Then, without exposing the base insulating film 212 to air, a semiconductor film, e.g., an amorphous silicon film containing hydrogen (a thickness of 54 nm) is stacked thereover. Alternatively, the base insulating film 212 can also be formed by stacking a silicon oxide film, a silicon nitride film, and a silicon oxide film containing nitrogen. For example, the base insulating film 212 may be formed by the steps of sequentially depositing a silicon nitride film containing oxygen to a thickness of 50 nm and depositing a silicon oxide film containing nitrogen to a thickness of 100 nm. Note that a silicon oxide film containing nitrogen or a silicon nitride film containing oxygen functions as a blocking layer for preventing diffusion of impurities such as alkali metals from the glass substrate.

Next, the amorphous silicon film is crystallized by a solid-phase epitaxy method, a laser crystallization method, a crystallization method with a catalytic metal, or the like, whereby a semiconductor film with a crystalline structure (a crystalline semiconductor film) such as a polycrystalline silicon film is formed. Here, a polycrystalline silicon film is formed by a crystallization method with a catalytic element. Specifically, the surface of the amorphous silicon film is coated with a solution containing 10 ppm by weight of nickel, using a spinner. Note that the spin coating method may be replaced with a method of applying a nickel element onto the entire surface by a sputtering method. Next, thermal treatment for crystallization is applied to form a semiconductor film with a crystalline structure (here, a polycrystalline silicon film). Here, thermal treatment (500° C. for one hour) is applied first, and then thermal treatment (550° C. for four hours) for crystallization is applied to obtain a polycrystalline silicon film.

Next, an oxide film on the surface of the polycrystalline silicon film is removed with diluted hydrofluoric acid or the like. After that, laser beam irradiation is performed in order to enhance crystallinity and recover defects that remain in crystal grains.

Note that in the case of obtaining a crystalline semiconductor film by crystallizing the amorphous silicon film by a laser crystallization method, or the case of applying laser irradiation after obtaining the crystalline semiconductor film in order to recover defects that remain in crystal grains, the following laser irradiation method may be used.

Laser irradiation can be performed by using either continuous-wave (CW) laser beams or pulsed laser beams. As laser beams that can be used here, beams emitted from one or more of the following laser oscillators can be used: gas lasers such as an Ar laser, a Kr laser, and an excimer laser; a laser in which single-crystalline YAG, YVO$_4$, forsterite (Mg$_2$SiO$_4$), YAlO$_3$, or GdVO$_4$ or polycrystalline (ceramic) YAG, Y$_2$O$_3$, YVO$_4$, YAlO$_3$, or GdVO$_4$ is doped with one or more laser media selected from Nd, Yb, Cr, Ti, Ho, Er, Tm, or Ta as dopant; a glass laser; a ruby laser; an alexandrite laser; a Ti:sapphire laser; a copper vapor laser; and a gold vapor laser. When irradiation is performed with the fundamental wave of such laser beams or the second to fourth harmonics of the fundamental wave, crystals with a large grain size can be obtained. For example, the second harmonic (532 nm) or the third harmonic (355 nm) of an Nd:YVO$_4$ laser (the fundamental wave of 1064 nm) can be used. In this case, a laser power density of about 0.01 to 100 MW/cm$^2$ (preferably, 0.1 to 10 MW/cm$^2$) is required, and irradiation is performed with a scanning rate of about 10 to 2000 cm/sec.

Note that the laser in which single-crystalline YAG, YVO$_4$, forsterite (Mg$_2$SiO$_4$), YAlO$_3$, or GdVO$_4$ or polycrystalline (ceramic) YAG, Y$_2$O$_3$, YVO$_4$, YAlO$_3$, or GdVO$_4$ is doped with one or more laser media selected from Nd, Yb, Cr, Ti, Ho, Er, Tm, or Ta as dopant; an Ar laser, a Kr laser, and a Ti:sapphire laser can be used as continuous-wave lasers, whereas they can also be used as pulsed lasers with a repetition rate of 10 MHz or more by being combined with a Q-switch operation or mode locking. When laser beams with a repetition rate of 10 MHz or more are used, it is possible for a semiconductor film to be irradiated with the next pulse after it is melted by the previous laser beam but before it becomes solidified. Therefore, unlike the case of using a pulsed laser with a low repetition rate, a solid-liquid interface of the semiconductor film can be moved continuously. Thus, crystal grains that have grown continuously in the scanning direction can be obtained.

In the case of using ceramic (polycrystals) as a medium, the medium can be formed into a desired shape in a short time at low cost. In the case of using single crystals, a medium with a columnar shape having a diameter of several mm and a length of several tens of mm is generally used. However, in the case of using ceramic, a medium larger than that can be formed.

The concentration of the dopant such as Nd or Yb in the medium which directly contributes to light emission cannot be changed to a large degree either in single crystals or polycrystals. Therefore, there is a limitation to improving the output of the laser by increasing the concentration of the dopant. However, in the case of using ceramic, a laser output can be drastically increased because the size of the medium can be significantly increased than the case of using single crystals.

Further, in the case of using ceramic, a medium with a parallelepiped shape or a rectangular parallelepiped shape can be formed easily. When such a medium is used and oscillated light is made travel within the medium in a zigzag manner, the oscillation path can be made long. Therefore, large amplification can be achieved and high output can be obtained. In addition, since a laser beam emitted from the medium with such a shape has a quadrangular cross section, it can easily be shaped into a linear beam unlike the case of using a circular beam, which is advantageous. When the laser beam emitted in this manner is shaped with optics, a linear beam with a short side of one mm or less and a long side of several mm to several m can be easily obtained. In addition, when excitation light is uniformly shone on the medium, a linear beam with uniform energy distribution in the long-side direction can be obtained.

By irradiating the semiconductor film with such linear beams, the entire surface of the semiconductor film can be annealed more uniformly. In the case where uniform annealing is required from one end to the other end of the linear laser beam, it is necessary to exercise ingenuity, for example, by using slits or the like so as to shield light at a portion where energy is attenuated.

Note that when laser irradiation is performed in the air or an oxygen atmosphere, an oxide film is formed on the surface of the semiconductor film by the laser irradiation.

Next, the surface of the oxide film formed by the above-described laser beam irradiation is treated with ozone water for 120 seconds, whereby a barrier layer made of an oxide film with a total thickness of one to five nm is formed. This barrier layer is formed in order to remove the catalytic element, e.g., nickel (Ni) that has been added into the semiconductor film for crystallization. Although the barrier layer is formed using ozone water here, the barrier layer may also be formed by a method of oxidizing the surface of the crystalline semiconductor film by UV irradiation in an oxygen atmosphere, a method of oxidizing the surface of the crystalline semiconductor film by oxygen plasma treatment, or a method of depositing an oxide film to a thickness of about one to 10 nm by a plasma CVD method, a sputtering method, an evaporation method, or the like. Further, the oxide film formed by the laser beam irradiation may be removed before the formation of the barrier layer.

Next, an amorphous silicon film containing an argon element to serve as a gettering site is formed over the barrier layer by a sputtering method, to a thickness of 10 to 400 nm, here 100 nm. In this embodiment mode, the amorphous silicon film containing an argon element is formed in an atmosphere containing argon, using a silicon target. In the case of forming an amorphous silicon film containing an argon element by a plasma CVD method, the following deposition conditions are set: a flow ratio of monosilane to argon ($SiH_4$: Ar) of 1:99, a deposition pressure of 6.665 Pa, an RF power density of 0.087 $W/cm^2$, and a deposition temperature of 350° C.

After that, thermal treatment is applied in an oven heated at 650° C. for three minutes, whereby the catalytic element is removed (gettered). Accordingly, the concentration of the catalytic element in the crystalline semiconductor film is reduced. The oven may be replaced with a lamp annealing apparatus.

Next, the amorphous silicon film containing an argon element which serves as the gettering site is selectively removed, using the barrier layer as an etching stopper. Then, the barrier layer is selectively removed with diluted hydrofluoric acid. Note that the barrier layer made of an oxide film is preferably removed after the gettering because nickel tends to move toward a region having a high oxygen concentration during the gettering.

When the semiconductor film is not crystallized with a catalytic element, the above-described steps including the formation of a barrier layer, the formation of a gettering site, thermal treatment for gettering, removal of the gettering site, removal of the barrier layer, and the like are not necessary.

Next, a thin oxide film is formed on the surface of the crystalline semiconductor film (e.g., a crystalline silicon film) using ozone water, and a resist mask is formed using a first photomask. Then, the crystalline semiconductor film is etched into desired shapes to form semiconductor films isolated in island shapes (referred to as "island-shaped semiconductor regions" in this specification) 231 and 232 (see FIG. 11A). After the formation of the island-shaped semiconductor regions, the resist mask is removed.

Next, the island-shaped semiconductor regions are doped with a small amount of impurity element (boron or phosphorus) as required in order to control the threshold voltages of TFTs. Here, a plasma-excited ion doping method is used without mass separation of diborane ($B_2H_6$).

Next, the oxide film is removed with an etchant containing fluorinated acid, while at the same time washing the surfaces of the island-shaped semiconductor regions 231 and 232. Then, an insulating film containing silicon as a main component is formed as the gate insulating film 213. Here, a silicon oxide film containing nitrogen (composition ratio of Si=32%, O=59%, N=7%, and H=2%) is formed to a thickness of 115 nm by a plasma CVD method.

Next, a metal film is formed over the gate insulating film 213, which is then patterned into gate electrodes 234 and 235, wires 214 and 215, and a terminal electrode 250 (see FIG. 11B).

Each of the gate electrodes 234 and 235, the wires 214 and 215, and the terminal electrode 250 can be formed using a single-layer film made of an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag), or copper (Cu); a single-layer film made of an alloy material or a compound material containing such an element as a main component; or a single-layer film made of nitride of such an element, e.g., titanium nitride, tungsten nitride, tantalum nitride, or molybdenum nitride.

Alternatively, a stacked film may be used instead of the single-layer film. For example, the gate electrodes 234 and 235, the wires 214 and 215, and the terminal electrode 250 can be each formed using a stacked film of tantalum nitride with a thickness of 30 nm and tungsten (W) with a thickness of 370 nm.

Next, the island-shaped semiconductor regions 231 and 232 are doped with an impurity which imparts one conductivity type, whereby source and drain regions 237 of the TFT 105 and source and drain regions 238 of the TFT 104 are formed. In this embodiment mode, the island-shaped semiconductor regions 231 and 232 are doped with an n-type impurity such as phosphorus (P) or arsenic (As) in order to form n-channel TFTs (see FIG. 11C).

Next, a first interlayer insulating film (not shown) made of a silicon oxide film is formed to a thickness of 50 nm by a CVD method, followed by the step of activating the impurity element that has been added into each island-shaped semiconductor region. This activation step is performed by a rapid thermal annealing (RTA) method with a lamp source, a method of irradiating the rear surface with YAG laser or excimer laser, thermal treatment with an oven, or a method combining any of the foregoing methods.

Next, a second interlayer insulating film 216 made of a silicon nitride film containing hydrogen and oxygen is formed to a thickness of 10 nm, for example.

Next, a third interlayer insulating film 217 made of an insulating material is formed over the second interlayer insulating film 216 (see FIG. 12A). The third interlayer insulating film 217 can be an insulating film formed by a CVD method. In this embodiment mode, a silicon oxide film containing nitrogen having a thickness of 900 nm is used as the third interlayer insulating film 217 in order to improve the adhesion thereof.

Next, thermal treatment (300 to 550° C. for one to 12 hours, e.g., 410° C. for one hour in a nitrogen atmosphere) is applied, whereby the island-shaped semiconductor films are hydrogenated. This step is performed in order to terminate dangling bonds in the island-shaped semiconductor films with hydrogen contained in the second interlayer insulating film 216. The island-shaped semiconductor films can be hydrogenated regardless of whether the gate insulating film 213 is provided or not.

Alternatively, the third interlayer insulating film 217 can be formed using an insulating film containing siloxane or a stacked structure having such an insulating film. Siloxane has a skeletal structure with the bond of silicon (Si) and oxygen (O). As a substituent of siloxane, an organic group containing at least hydrogen (e.g., an alkyl group or aromatic hydrocarbon) is used. Alternatively, a fluoro group may be used as the substituent, or both a fluoro group and an organic group containing at least hydrogen may be used as the substituent.

When the third interlayer insulating film 217 is formed using an insulating film containing siloxane or a stacked structure having such an insulating film, thermal treatment for hydrogenation of the island-shaped semiconductor films may be applied after the formation of the second interlayer insulating film 216 and before the formation of the third interlayer insulating film 217.

Next, a resist mask is formed to selectively etch the first interlayer insulating film, the second interlayer insulating film 216, and the third interlayer insulating film 217 or the gate insulating film 213, whereby contact holes are formed. Then, the resist mask is removed.

Note that the third interlayer insulating film 217 may be formed as required. In the case of not forming the third interlayer insulating film 217, the formation of the second interlayer insulating film 216 is followed by selective etching of the first interlayer insulating film, the second interlayer insulating film 216, and the gate insulating film 213, so that contact holes are formed.

Next, a stacked metal film is deposited by a sputtering method, and a resist mask is formed. Then, the stacked metal film is selectively etched into a wire 284, a connection electrode 285, a terminal electrode 281, source and drain electrodes 282 of the TFT 104, and source and drain electrodes 283 of the TFT 105 (see FIG. 12B).

In FIG. 12B, each of the wire 284, the connection electrode 285, the terminal electrode 281, the source and drain electrodes 282 of the TFT 104, and the source and drain electrodes 283 of the TFT 105 is formed of a single-layer conductive film.

Such a single layer is preferably a titanium (Ti) film in terms of heat resistance, conductivity, and the like. In addition, such a titanium film may be replaced with a single-layer film made of an element selected from tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), or platinum (Pt); a single-layer film made of an alloy material or a compound material containing such an element as a main component; or a single-layer film made of nitride of such an element, e.g., titanium nitride, tungsten nitride, tantalum nitride, or molybdenum nitride. When each of the wire 284, the connection electrode 285, the terminal electrode 281, the source and drain electrodes 282 of the TFT 104, and the source and drain electrodes 283 of the TFT 105 is formed using a single-layer film, the number of film deposition steps in the fabrication process can be reduced.

FIG. 12C illustrates a case where each of a wire 219, a connection electrode 220, a terminal electrode 251, source and drain electrodes 241 of the TFT 104, and source and drain electrodes 242 of the TFT 105 is provided with a protective electrode.

Each of the conductive films of the lower layer, i.e., the wire 219, the connection electrode 220, the terminal electrode 251, the source and drain electrodes 241 of the TFT 104, and the source and drain electrodes 242 of the TFT 105 has a stacked structure of a high-melting-point metal film and a low-resistance metal film (e.g., an aluminum alloy or pure aluminum). Here, each of the conductive films of the lower layer, i.e., the wire 219, the connection electrode 220, the terminal electrode 251, and the source and drain electrodes 241 and 242 is formed to have a three-layer structure in which a titanium (Ti) film, an aluminum (Al) film, and a Ti film are sequentially stacked.

Further, protective electrodes 218, 245, 248, 246, and 247 are formed so as to cover the wire 219, the connection electrode 220, the terminal electrode 251, the source and drain electrodes 241 of the TFT 104, and the source and drain electrodes 242 of the TFT 105, respectively.

In etching a photoelectric conversion layer 103 which will be formed in a later step, the wire 219 is protected by the upper protective electrode 218. The material of the protective electrode 218 is preferably a conductive material having a lower etching rate than the material of the photoelectric conversion layer 103 with respect to a gas (or an etchant) used for etching the photoelectric conversion layer 103. In addition, the material of the protective electrode 218 is preferably a conductive material which does not react with the photoelectric conversion layer 103 to become an alloy. The other protective electrodes 245, 248, 246, and 247 are also formed with materials and fabrication steps similar to those of the protective electrode 218.

The protective electrode 218 which covers the wire 219 is formed by the steps of, for example, depositing a conductive metal film (e.g., titanium (Ti) or molybdenum (Mo)) which is unlikely to become an alloy by reaction with a photoelectric conversion layer (typically, amorphous silicon) that is to be formed in a later step, forming a resist mask, and selectively etching the conductive metal film. Here, a Ti film with a thickness of 200 nm obtained by a sputtering method is used. Similarly, the connection electrode 220, the terminal electrode 251, the source and drain electrodes 241 of the TFT 104, and the source and drain electrodes 242 of the TFT 105 are also covered with conductive metal films, whereby the protective electrodes 245, 248, 246, and 247 are formed. Thus, the conductive metal film can also cover the side faces of each electrode at which the Al film of the second layer is exposed, whereby the conductive metal film can also prevent diffusion of aluminum atoms to the photoelectric conversion layer.

Next, a photoelectric conversion layer 103, which includes a p-type semiconductor layer 103p, an i-type semiconductor layer 103i, and an n-type semiconductor layer 103n, is formed over the third interlayer insulating film 217.

The p-type semiconductor layer 103p may be formed by depositing an amorphous silicon film containing an impurity element of Group 13, e.g., boron (B) by a plasma CVD method.

Figure 13A:
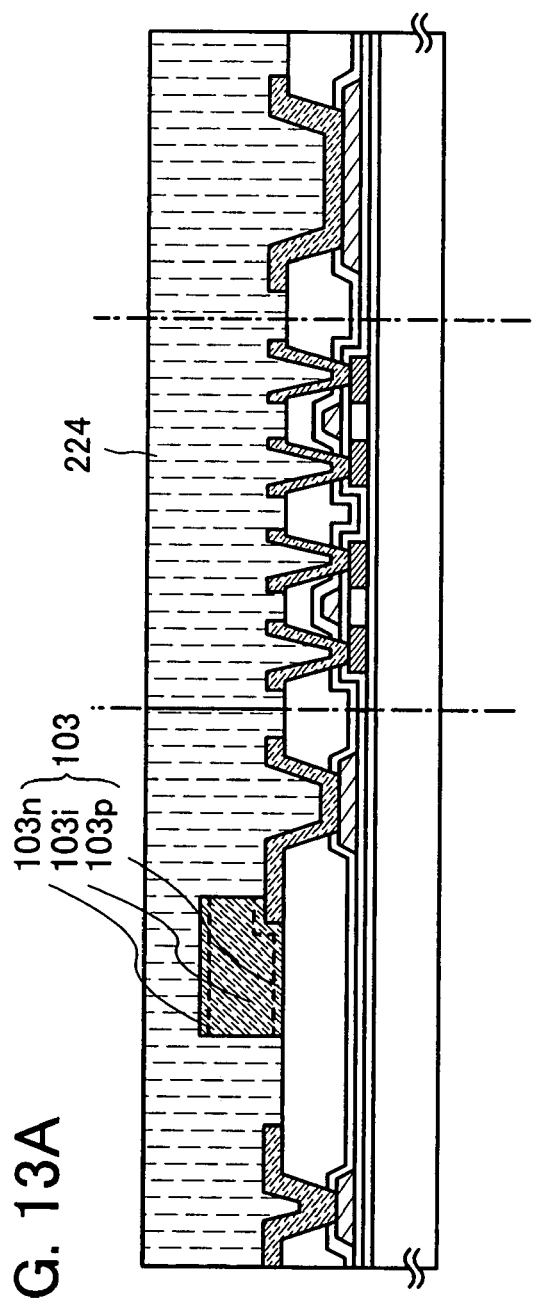
FIGS. 13A and 13B are cross-sectional views illustrating the steps of fabricating a semiconductor device of the invention.

In FIG. 13A, the wire 284 is in contact with the bottom layer of the photoelectric conversion layer 103, i.e., the p-type semiconductor layer 103p in this embodiment mode is.

In the case where the protective electrodes are formed, the wire 219 and the protective electrode 218 are in contact with the bottom layer of the photoelectric conversion layer 103, i.e., the p-type semiconductor layer 103p in this embodiment mode.

After the formation of the p-type semiconductor layer 103p, the i-type semiconductor layer 103i and the n-type semiconductor layer 103n are sequentially formed. Accordingly, the photoelectric conversion layer 103 having the p-type semiconductor layer 103p, the i-type semiconductor layer 103i, and the n-type semiconductor layer 103n is formed.

The i-type semiconductor layer 103i may be formed by depositing an amorphous silicon film by a plasma CVD method, for example. The n-type semiconductor layer 103n may be formed either by depositing an amorphous silicon film containing an impurity element of Group 15, e.g., phosphorus (P) or by depositing an amorphous silicon film and doping the film with an impurity element of Group 15.

Further, not only amorphous semiconductor films, but also semi-amorphous semiconductor films can be used for the p-type semiconductor layer 103p, the i-type semiconductor layer 103i, and the n-type semiconductor layer 103n.

Next, a sealing layer 224 made of an insulating material (e.g., an inorganic insulating film containing silicon) is deposited over the entire surface to a thickness of 1 to 30 µm, whereby the state shown in FIG. 13A is obtained. Here, a silicon oxide film containing nitrogen is formed as an insulating film to a thickness of 1 µm by a CVD method. Using the insulating film formed by a CVD method can improve the adhesion.

Next, the sealing layer 224 is etched to form openings, and terminal electrodes 221 and 222 are formed by a sputtering method. The terminal electrodes 221 and 222 are each formed by stacking a titanium (Ti) film (100 nm), a nickel (Ni) film (300 nm), and a gold (Au) film (50 nm). The thusly obtained terminal electrodes 221 and 222 have a fixing strength of over 5 N, which is a sufficient fixing strength to serve as a terminal electrode.

Figure 13B:
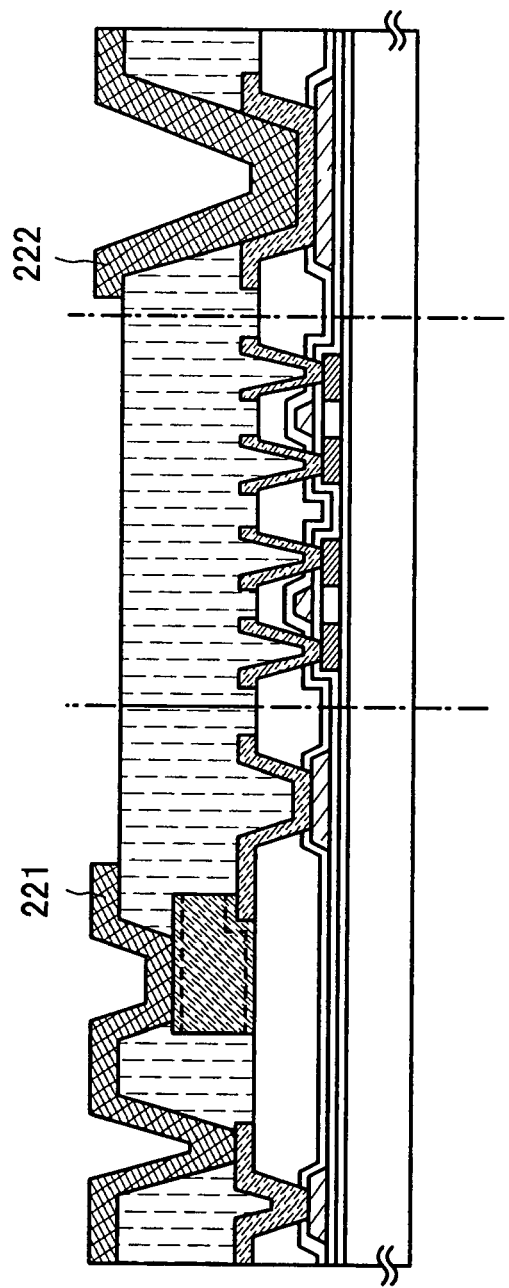

Through the above-described steps, the terminal electrodes 221 and 222 capable of solder bonding are formed. Thus, the structure shown in FIG. 13B is obtained.

Next, the structure is cut into individual sections to obtain a plurality of photosensor chips. A large number of photosensor chips (2 mm×1.5 mm) can be obtained out of one large substrate (e.g., 600 cm×720 cm).

Figure 14A:
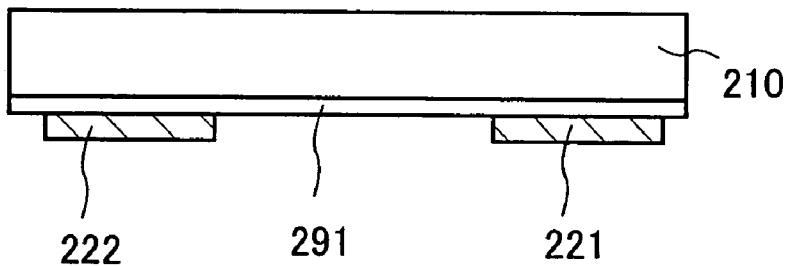
FIGS. 14A to 14C are top views of a semiconductor device of the invention.
Figure 14B:
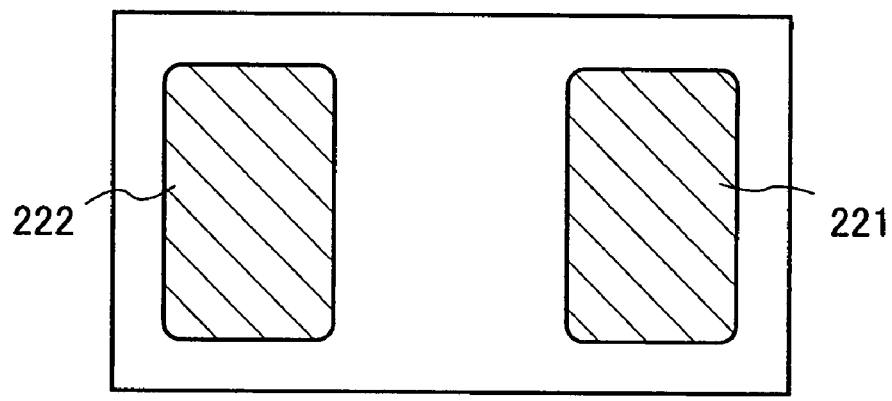
Figure 14C:
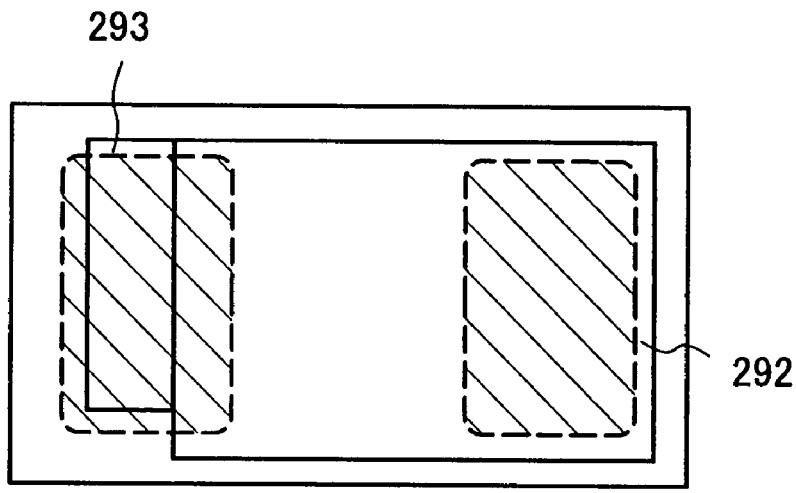

FIG. 14A shows a cross section of one photosensor chip (2 mm×1.5 mm) that has been cut out, and FIGS. 14B and 14C show a bottom view and a top view thereof, respectively. Portions common to FIG. 10 and FIGS. 14A to 14C are denoted by common reference numerals. Note that in FIG. 14A, the total thickness of the substrate 210, an element formation region 291, and the terminal electrodes 221 and 222 is 0.8±0.05 mm.

In order to reduce the total thickness of the photosensor chip, the following steps may also be performed: thinning the substrate 210 by CMP (Chemical Mechanical Polishing) or the like and cutting the substrate into individual sections with a dicer to obtain a plurality of photosensor chips.

In FIG. 14B, each of the terminal electrodes 221 and 222 has a size of 0.6 mm×1.1 mm, and the electrode gap is 0.4 mm. In addition, in FIG. 14C, a light-receiving portion 292 has an area of 1.57 mm$^2$. Further, an amplifier circuit portion 293 has about 100 TFTs.

Finally, the thusly obtained photosensor chip is mounted on a mounting surface of the substrate 260. Note that connection between the terminal electrode 221 and the electrode 261 and connection between the terminal electrode 222 and the electrode 262 are carried out with the solders 264 and 263, respectively. Specifically, solder paste is formed in advance on the electrodes 261 and 262 of the substrate 260 by a screen printing method or the like so that the solders and the terminal electrodes are in direct contact with each other, and then, a reflow soldering process is performed. The reflow soldering process is performed in an inert gas atmosphere at a temperature of about 255 to 265° C. for about 10 seconds. Instead of solders, it is also possible to use bumps formed of metal (e.g., gold or silver), bumps formed of a conductive resin, or the like. Further, it is also possible to use lead-free solder in consideration of environmental problems (see FIG. 10).

Through the above-described steps, a semiconductor device having the photoelectric conversion device which includes the photoelectric conversion layer 103 and the current mirror circuit 111 can be obtained.

According to this embodiment mode, a semiconductor device having a photoelectric conversion device in which a decrease in photosensitivity is suppressed can be provided.

Note that this embodiment mode can be combined with other embodiment modes as required.

Embodiment Mode 2

Figure 15:
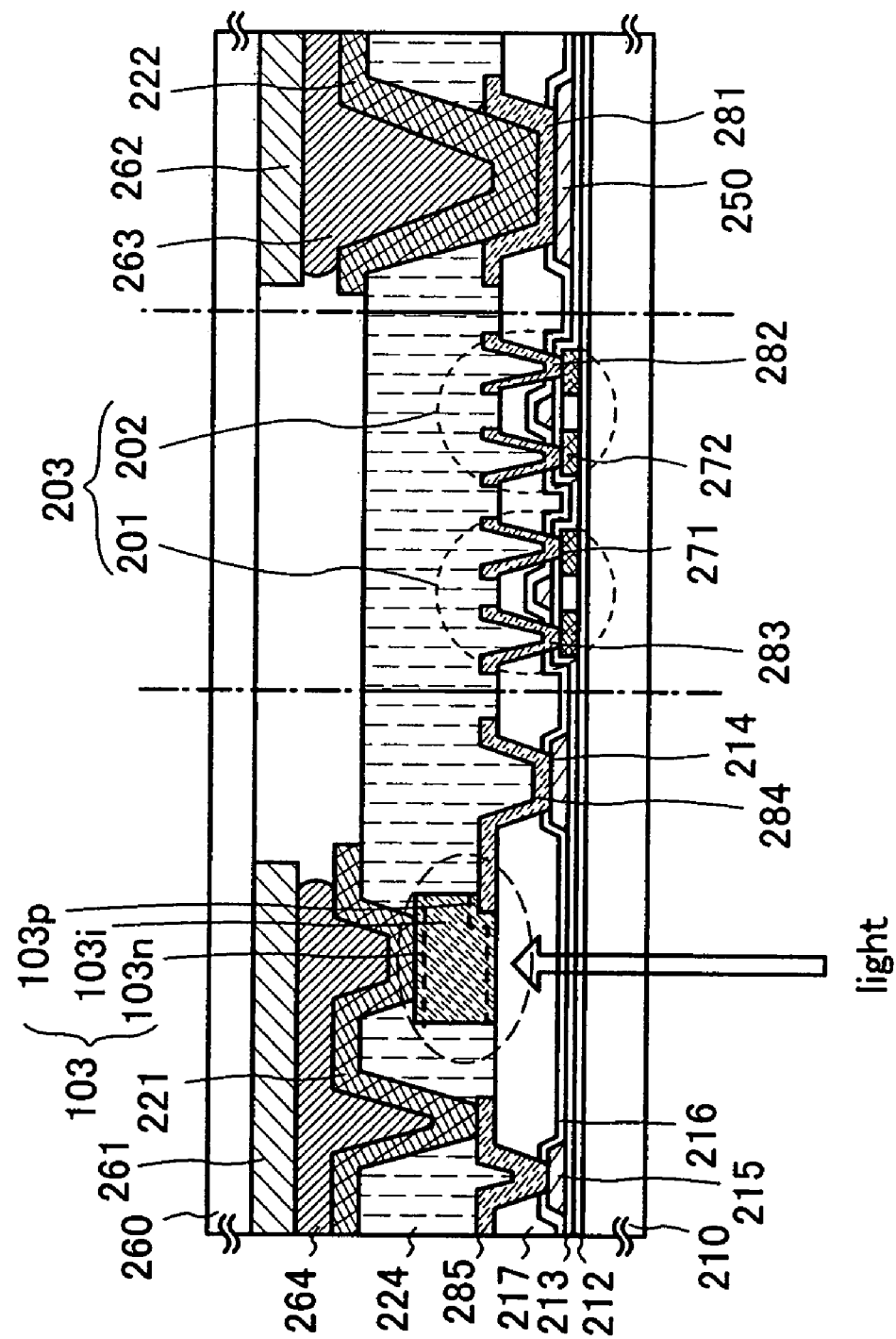
FIG. 15 is a cross-sectional view of a semiconductor device of the invention.

This embodiment mode will describe an example of an amplifier circuit constructed from p-channel TFTs with reference to FIGS. 9 and 15. Note that portions common to this embodiment and Embodiment Mode 1 are denoted by common reference numerals. Therefore, such portions may be formed through the same fabrication steps as those described in Embodiment Mode 1.

When an amplifier circuit, e.g., the current mirror circuit 203 is constructed from the p-channel TFTs 201 and 202, the impurity which imparts one conductivity type to the island-shaped semiconductor regions in Embodiment Mode 1 may be replaced with a p-type impurity, e.g., boron (B).

FIG. 9 is an equivalent circuit diagram of a photosensor in this embodiment mode in the case where the current mirror circuit 203 is constructed from the p-channel TFTs 201 and 202, and FIG. 15 is a cross-sectional view thereof.

In FIGS. 9 and 15, the terminal electrode 221 is electrically connected to the n-type semiconductor layer 103n of the photoelectric conversion layer 103 and to the p-channel TFT 201, while the terminal electrode 222 is electrically connected to the p-channel TFT 202. The p-channel TFT 201 is electrically connected to an electrode (an anode) of the photoelectric conversion layer 103. The photoelectric conversion layer 103 may be formed by sequentially stacking the n-type semiconductor layer 103n, the i-type semiconductor layer 103i, and the p-type semiconductor layer 103p, on a second electrode (the anode) electrically connected to the p-channel TFT 201. Then, a first electrode (a cathode) may be formed on the p-type semiconductor layer 103p.

Alternatively, the stack order of the photoelectric conversion layer may be reversed such that the p-type semiconductor layer, the i-type semiconductor layer, and the n-type semiconductor layer are sequentially stacked on the first electrode (the cathode), and then the second electrode (the anode) connected to the p-channel TFT 201 may be formed on the n-type semiconductor layer.

As shown in FIG. 15, the island-shaped semiconductor regions of the p-channel TFTs 201 and 202 are doped with a p-type impurity, e.g., boron (B), so that source and drain regions 271 are formed in the p-channel TFT 201, and source and drain regions 272 are formed in the p-channel TFT 202.

Each of the wire 284, the connection electrode 285, the terminal electrode 281, the source and drain electrodes 283 the TFT 201, and the source and drain electrodes 282 of the TFT 202 is formed with a single-layer conductive film in accordance with Embodiment Mode 1.

In addition, as in FIG. 12C, the wire 284, the connection electrode 285, the terminal electrode 281, the source and drain electrodes 283 of the TFT 201, and the source and drain electrodes 282 of the TFT 202 may be replaced respectively with the wire 219 and the protective electrode 218, the connection electrode 220 and the protective electrode 245, the terminal electrode 251 and the protective electrode 248, the source and drain electrodes 242 of the TFT 201 and the protective electrode 247, and the source and drain electrodes 241 of the TFT 202 and the protective electrode 246. Each layer may be formed in accordance with Embodiment Mode 1.

According to this embodiment mode, a semiconductor device having a photoelectric conversion device in which a decrease in photosensitivity is suppressed can be provided.

Note that this embodiment mode can be combined with other embodiment modes as required.

Embodiment Mode 3

This embodiment mode will describe a photosensor and an amplifier circuit constructed from bottom-gate TFTs, and a method of fabricating them, with reference to FIG. 16A through 18. Note that portions common to this embodiment and Embodiment Modes 1 and 2 are denoted by common reference numerals.

Figure 16A:
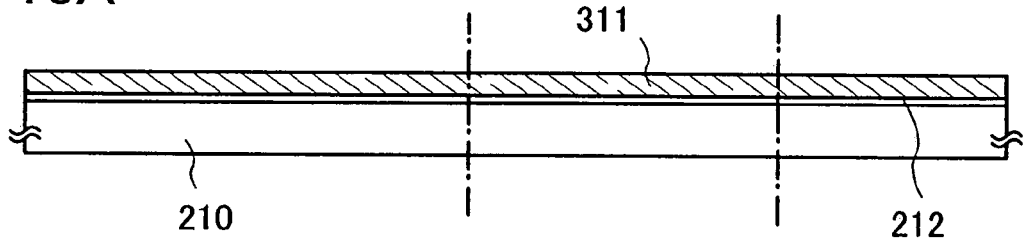
FIGS. 16A to 16E are cross-sectional views illustrating the steps of fabricating a semiconductor device of the invention.

First, a base insulating film 212 and a metal film 311 are formed over a substrate 210 (see FIG. 16A). In this embodiment mode, a stacked film of, for example, tantalum nitride with a thickness of 30 nm and tungsten (W) with a thickness of 370 nm is used as the metal film 311.

Besides, the metal film 311 can also be formed using a single-layer film made of an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag), or copper (Cu); a single-layer film made of an alloy material or a compound material containing such an element as a main component; or a single-layer film made of nitride of such an element, e.g., titanium nitride, tungsten nitride, tantalum nitride, or molybdenum nitride.

Note that it is also possible to form the metal film 311 directly over the substrate 210 without forming the base insulating film 212 over the substrate 210.

Figure 16B:
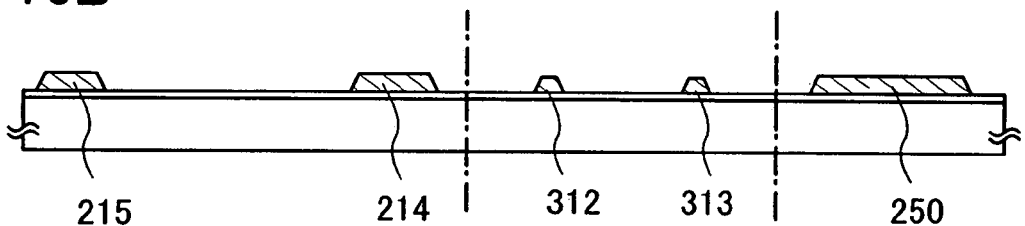
Figure 16C:
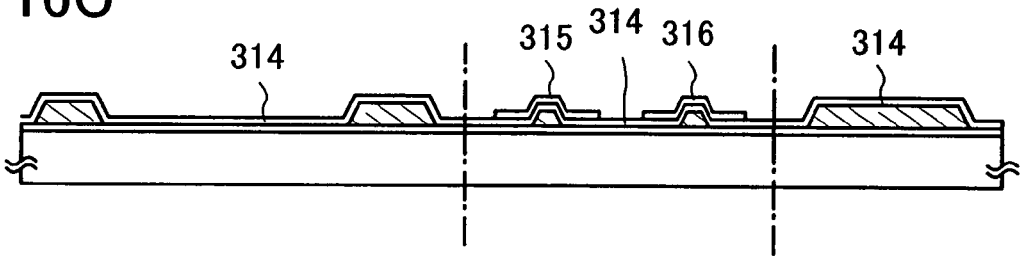
Figure 16D:
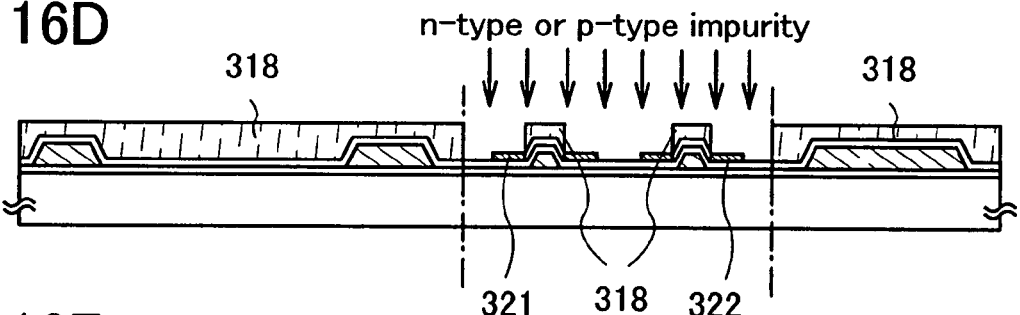

Next, the metal film 311 is patterned into gate electrodes 312 and 313, wires 214 and 215, and a terminal electrode 250 (see FIG. 16B).

Next, a gate insulating film 314, which covers the gate electrodes 312 and 313, the wires 214 and 215, and the terminal electrode 250, is formed. In this embodiment mode, the gate insulating film 314 is formed using an insulating film containing silicon as a main component, e.g., a silicon oxide film containing nitrogen (composition ratio of Si=32%, O=59%, N=7%, and H=2%) which is deposited to a thickness of 115 nm by a plasma CVD method.

Next, island-shaped semiconductor regions 315 and 316 are formed over the gate insulating film 314. The island-shaped semiconductor regions 315 and 316 may be formed using materials and fabrication steps similar to those of the islands-shaped semiconductor regions 231 and 232 described in Embodiment Mode 1 (see FIG. 16C).

After the formation of the island-shaped semiconductor regions 315 and 316, a mask 318 is formed to cover portions excluding regions that will be source and drain regions 321 of a TFT 301 and source and drain regions 322 of a TFT 302. Then, unmasked regions are doped with an impurity which imparts one conductivity type (see FIG. 16D). As for the impurity which imparts one conductivity type, in the case of forming n-channel TFTs, phosphorus (P) or arsenic (As) may be used as an n-type impurity; in the case of forming p-channel TFTs, on the other hand, boron (B) may be used as a p-type impurity. In this embodiment mode, the island-shaped semiconductor regions 315 and 316 are doped with phosphorus (P) which is an n-type impurity, so that the source and drain regions 321 and a channel formation region therebetween of the TFT 301 are formed; likewise, the source and drain regions 322 and a channel formation region therebetween of the TFT 302 are formed.

Figure 16E:
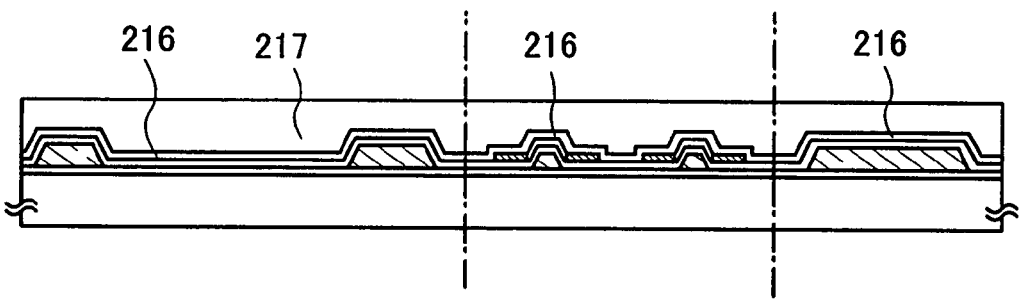

Next, the mask 318 is removed and a first interlayer insulating film (not shown), a second interlayer insulating film 216, and a third interlayer insulating film 217 are formed (see FIG. 16E). For the materials and fabrication steps of the first interlayer insulating film, the second interlayer insulating film 216, and the third interlayer insulating film 217, Embodiment Mode 1 may be referred to.

Next, contact holes are formed in the first interlayer insulating film, the second interlayer insulating film 216, and the third interlayer insulating film 217. Then, a single-layer metal film is deposited and etched selectively to form a wire 284, a connection electrode 285, a terminal electrode 281, source and drain electrodes 341 of the TFT 301, and source and drain electrodes 342 of the TFT 302 (see FIG. 17A).

Figure 17A:
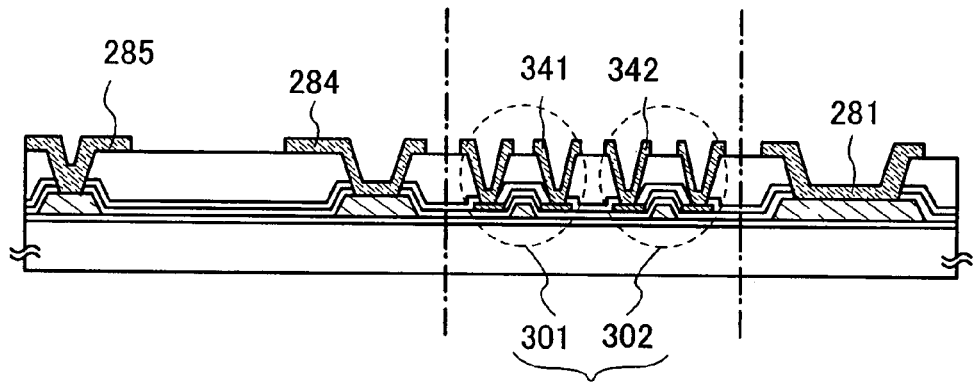
FIGS. 17A to 17D are cross-sectional views illustrating the steps of fabricating a semiconductor device of the invention.
Figure 17B:
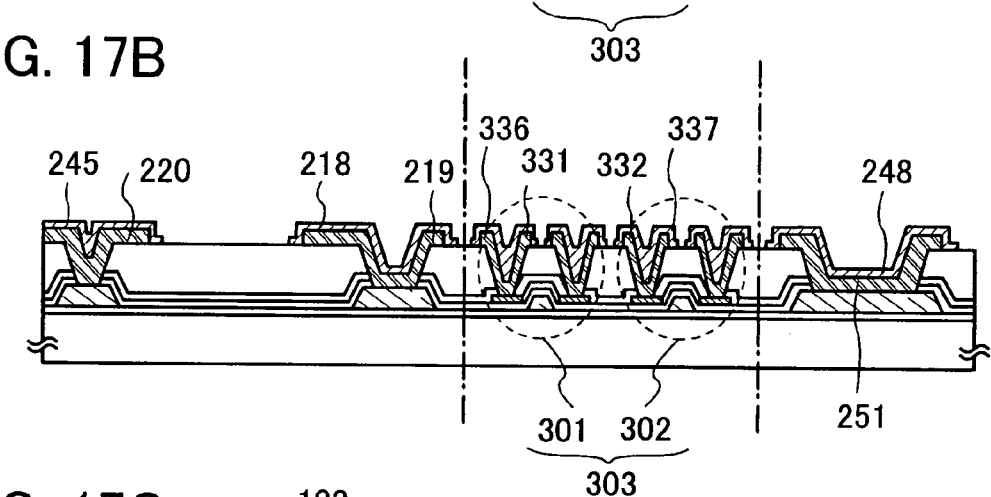

Instead of the single-layer conductive film, a stacked film may also be used for the wire 284, the connection electrode 285, the terminal electrode 281, the source and drain electrodes 341 of the TFT 301, and the source and drain electrodes 342 of the TFT 302. FIG. 17B illustrates the case where those layers are formed with a stacked film.

Referring to FIG. 17B, the wire 284, the connection electrode 285, the terminal electrode 281, the source and drain electrodes 341 of the TFT 301, and the source and drain electrodes 342 of the TFT 302 are replaced respectively with the wire 219 and the protective electrode 218, the connection electrode 220 and the protective electrode 245, the terminal electrode 251 and the protective electrode 248, the source and drain electrodes 331 of the TFT 301 and the protective electrode 336, and the source and drain electrodes 332 of the TFT 302 and the protective electrode 337.

Through the above-described steps, the bottom-gate TFTs 301 and 302 can be formed. With the bottom-gate TFTs 301 and 302, a current mirror circuit 303 can be constructed.

Figure 17C:
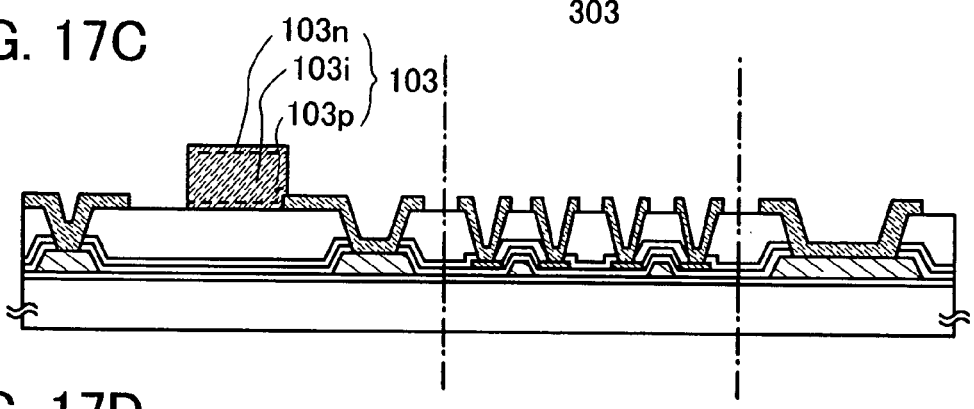

Next, a photoelectric conversion layer 103, which includes a p-type semiconductor layer 103*p*, an i-type semiconductor layer 103*i*, and an n-type semiconductor layer 103*n*, is formed over the third interlayer insulating film 217 (see FIG. 17C). For the material and fabrication steps of the photoelectric conversion layer 103, Embodiment Modes 1 and 2 may be referred to.

Figure 17D:
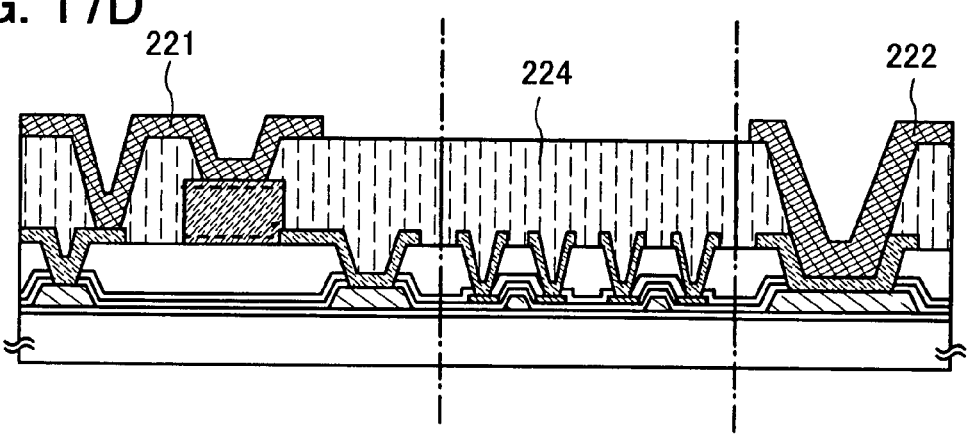

Next, a sealing layer 224 and terminal electrodes 221 and 222 are formed (see FIG. 17D). The terminal electrode 221 is connected to the n-type semiconductor layer 100n, and the terminal electrode 222 is formed through the same steps as the terminal electrode 221.

Further, a substrate 260 having electrodes 261 and 262 is mounted with solders 263 and 264. Note that the electrode 261 of the substrate 260 is mounted on the terminal electrode 221 with the solder 264, while the electrode 262 of the substrate 260 is mounted on the terminal electrode 222 with the solder 263 (see FIG. 18).

Figure 18:
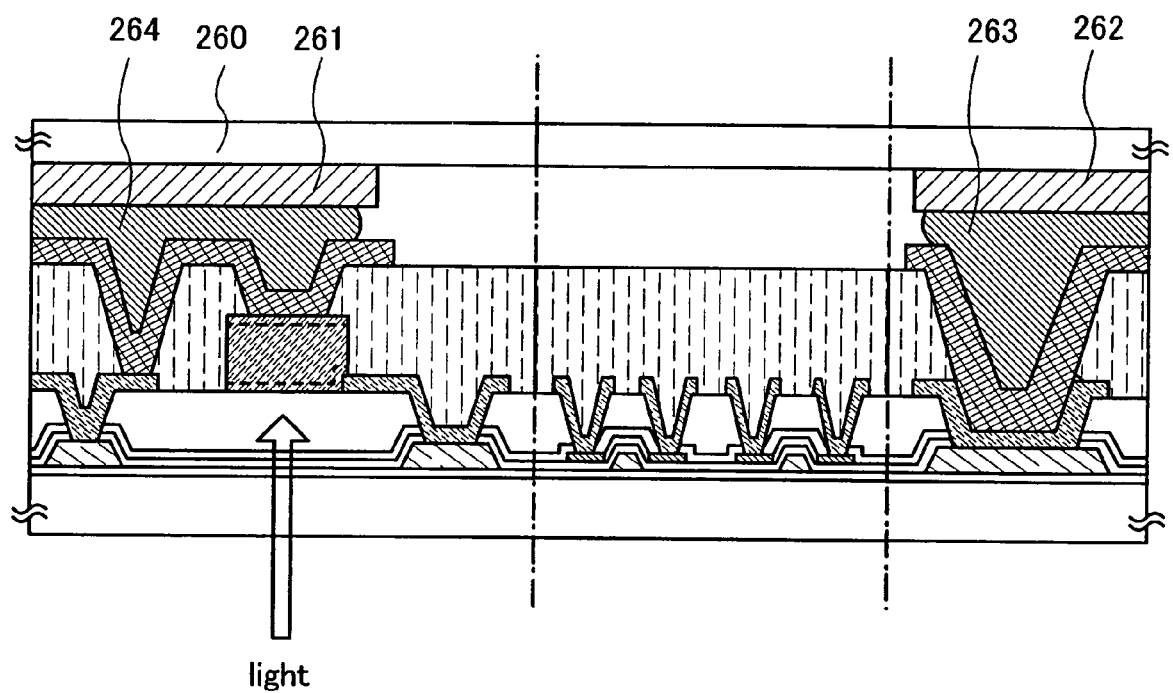
FIG. 18 is a cross-sectional view illustrating the step of fabricating a semiconductor device of the invention.

Note that a semiconductor device similar to that shown in FIG. 18 can also be fabricated by using a semiconductor device with the structure shown in FIG. 17B in conjunction with the fabrication steps described above.

According to this embodiment mode, a semiconductor device having a photoelectric conversion device in which a decrease in photosensitivity is suppressed can be provided.

Note that this embodiment mode can be combined with other embodiment modes as required.

Embodiment Mode 4

This embodiment mode will describe a battery used as a power supply, with reference to FIGS. 27 through 33.

In this specification, a device which includes a battery, an antenna, a circuit for charging the battery with an electromotive force that is generated from electromagnetic waves received at the antenna, and a medium for charging the battery with the electromotive force is also called an RF battery or a wireless battery.

In addition, a battery in this specification is also called a secondary battery or a storage battery, which converts electrical energy obtained from an external power supply into chemical energy, stores the energy therein, and outputs the energy as required. In addition, "capacitor" refers to a device having two conductive electrodes insulated from each other, in which charges can be stored by an electrical attractive force when one of the conductive electrodes is charged positively and the other is charged negatively.

Note that "battery" as referred to in this specification means a battery whose continuous operating time can be restored by charging. Further, as a battery, a battery formed in a sheet-like form or a battery formed in a cylindrical form with a small diameter is preferably used, although the type of battery used may differ depending on the intended use of the device. For example, by using a lithium battery, preferably a lithium polymer battery that uses a gel electrolyte, a lithium ion battery, or the like, miniaturization is possible. Needless to say, any battery may be used, as long as it is chargeable. For example, the following batteries that are chargeable and dischargeable can be used: a nickel metal hydride battery, a nickel cadmium battery, an organic radical battery, a lead-acid battery, an air secondary battery, a nickel-zinc battery, and a silver-zinc battery. Alternatively, a high-capacity capacitor or the like may also be used.

As a high-capacity capacitor that can be used as a battery in this embodiment mode, it is preferable to use a capacitor having electrodes with large opposed areas. In particular, it is preferable to use a double-layer electrolytic capacitor which is formed from an electrode material having a large specific surface area such as activated carbon, fullerene, or a carbon nanotube. A capacitor is simpler in structure than a battery. Further, a capacitor can be easily formed to be thin and formed with stacked layers. A double-layer electrolytic capacitor has a function of storing electricity and will not deteriorate much even after it is charged and discharged a number of times. Further, the double-layer electrolytic capacitor has an excellent property in that it can be charged rapidly.

The battery in this embodiment mode can be used as the power supply 101 in FIG. 1, for example.

Figure 27:
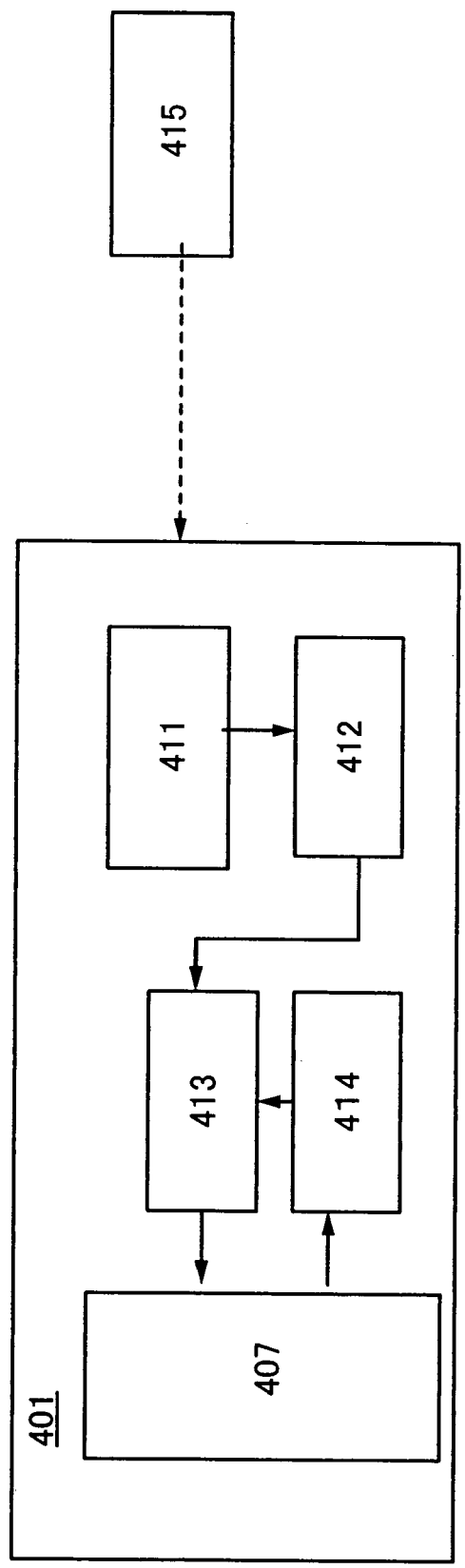
FIG. 27 is a block diagram illustrating a battery of the invention.

Referring to FIG. 27, an RF battery 401 includes a battery 407, a charging circuit 413, a charging control circuit 414, an internal antenna circuit 411, and a rectifier circuit 412. An external antenna circuit 415 is provided outside of the RF battery 401. The internal antenna circuit 411 receives radio signals generated by the external antenna circuit 415. The signal received at the internal antenna circuit 411 is input to and converted to a DC signal by the rectifier circuit 412. The charging circuit 413 generates a current based on the electricity from the rectifier circuit 412, thereby charging the battery 407. The charging control circuit 414 monitors the charged level of the battery 407 so that the battery 407 is not overcharged. When the charged level of the battery 407 is increased, the charging control circuit 414 controls the charging circuit 413 to suppress the amount of charging. Note that the charging circuit 413 can be constructed from a voltage control circuit (also called a regulator) and a switch circuit, for example. When a diode is used as the switch circuit, the charging control circuit may be omitted. In addition, the voltage control circuit can be replaced with a circuit for controlling voltage and current or a constant current source circuit.

Figure 28A:
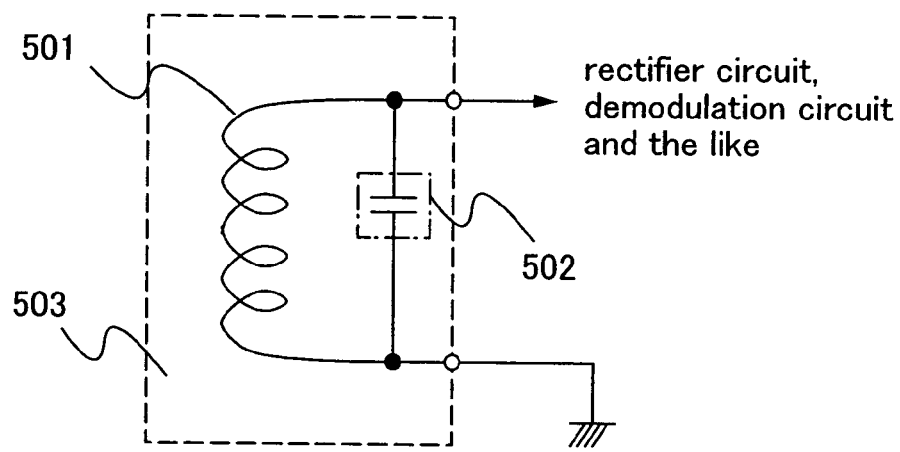
FIGS. 28A and 28B illustrate circuits included in a battery of the invention.
Figure 28B:
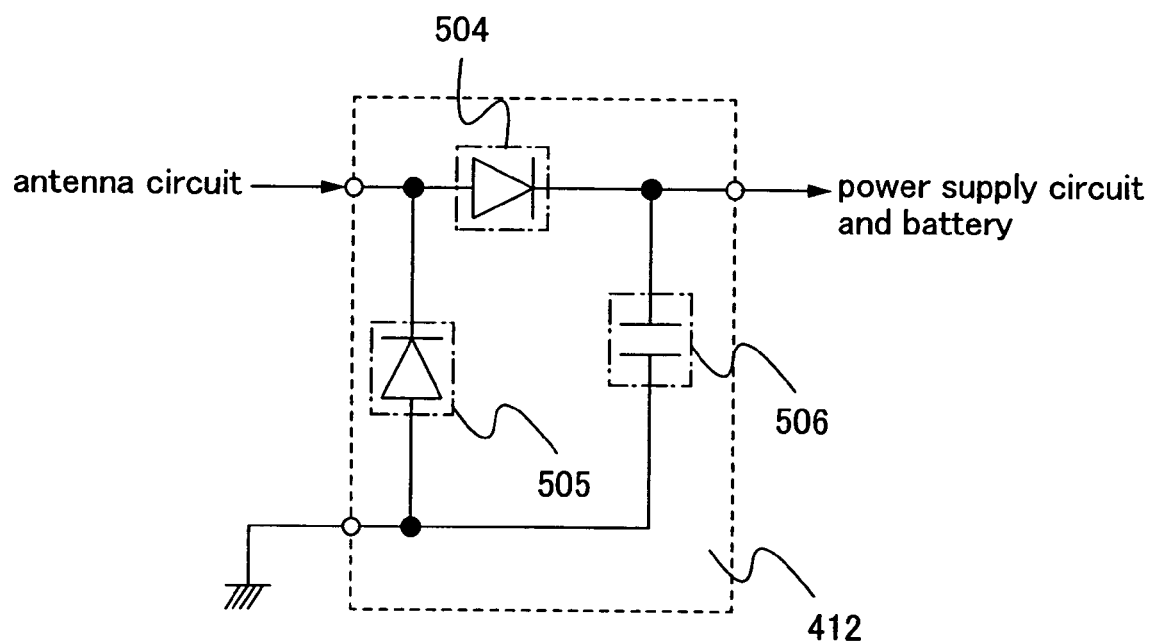

Note that the internal antenna circuit 411 and the external antenna circuit 415 can be an antenna circuit 503 shown in FIG. 28A, for example, which includes an antenna 501 and a resonant capacitor 502. In addition, the rectifier circuit 412 may be any circuit as long as it can convert an AC signal, which is induced by electromagnetic waves received at the internal antenna circuit 411 and the external antenna circuit 415, into a DC current. For example, as shown in FIG. 28B, the rectifier circuit 412 can be constructed from a diode 504, a diode 505, and a smoothing capacitor 506.

Note that radio signals received at the internal antenna circuit 411 in this embodiment mode can be signals with a frequency band of, for example, 125 kHz, 13.56 MHz, 915 MHz, or 2.45 GHz. Needless to say, the frequency of signals received at the internal antenna circuit is not limited to these, and for example, any of the following frequencies can be used: submillimeter waves of 300 GHz to 3 THz, millimeter waves of 30 GHz to 300 GHz, microwaves of 3 GHz to 30 GHz, a ultra high frequency of 300 MHz to 3 GHz, a very high frequency of 30 MHz to 300 MHz, a high frequency of 3 MHz to 30 MHz, a medium frequency of 300 kHz to 3 MHz, a low frequency of 30 kHz to 300 kHz, and a very low frequency of 3 kHz to 30 kHz.

Signals communicated between the internal antenna circuit 411 and the external antenna circuit 415 are signals obtained by carrier modulation. A carrier modulation method can be either analog modulation or digital modulation, and any of amplitude modulation, phase modulation, frequency modulation, and spread spectrum can be used. Preferably, amplitude modulation or frequency modulation is used. Further, for radio signals, the following signals can be used: radio waves (e.g., 800 to 900 MHz, 1.5 GHz, or 1.9 to 2.1 GHz) from mobile-phone relay stations, radio waves radiated from mobile phones, radio waves (e.g., 40 kHz) of radio wave clocks, noise (e.g., 60 Hz) of domestic AC power supply, signals randomly received from other readers/writers, and the like. Further, when a plurality of antenna circuits having antennas with different lengths or shapes are used for the internal antenna circuit 411, it is possible to use various radio signals for charging the battery 407.

The antennas provided in the internal antenna circuit 411 and the external antenna circuit 415 are formed to have lengths and shapes that can receive the above-described radio signals with high sensitivity. When a plurality of radio waves are to be received, it is preferable to provide a plurality of antenna circuits with different lengths or shapes.

Further, the shape of the antenna provided in the internal antenna circuit 411 or the external antenna circuit 415 is not specifically limited. That is, a signal transmission method applied to the internal antenna circuit 411 or the external antenna circuit 415 can be any of an electromagnetic coupling method, an electromagnetic induction method, a microwave method, and the like. The transmission method may be selected as appropriate by a practitioner in consideration of the intended use of the device. Thus, an antenna with an optimum length and shape may be provided in accordance with the transmission method.

For example, in the case of using an electromagnetic coupling method or an electromagnetic induction method (e.g., 13.56 MHz) as the transmission method, a conductive film functioning as an antenna is formed in an annular form (e.g., a loop antenna) or a helical form (e.g., a spiral antenna, or a helical antenna) in order to utilize electromagnetic induction that occurs with changes in magnetic density.

In the case of using a microwave method (e.g., UHF band (860 to 960 MHz) or 2.45 GHz band) as the transmission method, the length and shape of the conductive film functioning as the antenna may be appropriately determined in consideration of the wavelength of electromagnetic waves used for signal transmission. For example, the conductive film functioning as the antenna may be formed in a linear form (e.g., a dipole antenna), a flat form (e.g., a patch antenna), or the like. In addition, the shape of the conductive film functioning as the antenna is not limited to the linear form. For example, the conductive film may be provided in a curved form, a serpentine form, or a form combining them.

Exemplary shapes of the antenna provided in the internal antenna circuit 411 or the external antenna circuit 415 are shown in FIGS. 29A to 29E. For example, a layout shown in FIG. 29A may be used in which an antenna 523 is disposed all around a circuit element 522 having various circuits and the like. Note that the circuit element 522 herein includes various elements in a semiconductor device capable radio communication excluding the internal antenna circuit 411 or the external antenna circuit 415.

Figure 29A:
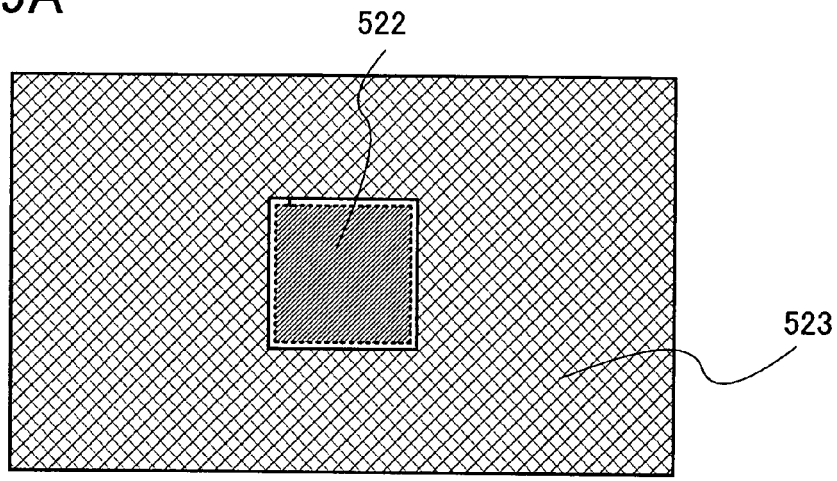
FIGS. 29A to 29E are top views of a circuit included in a battery of the invention.
Figure 29B:
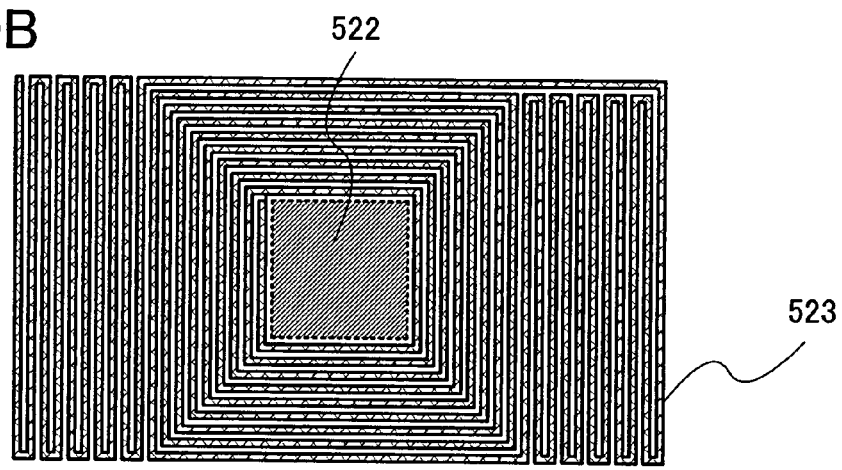
Figure 29C:
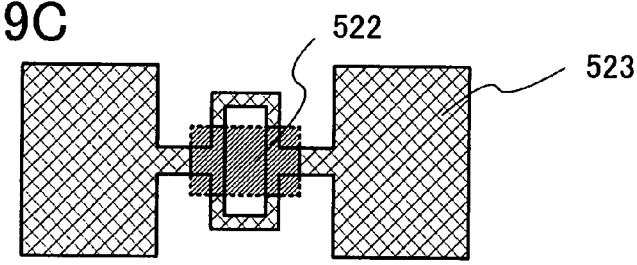
Figure 29D:
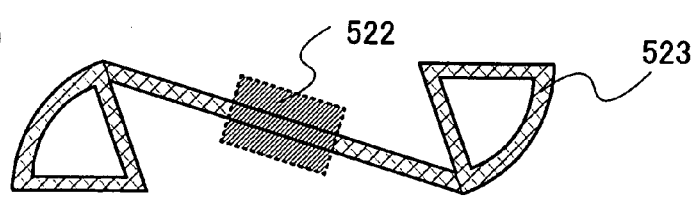
Figure 29E:
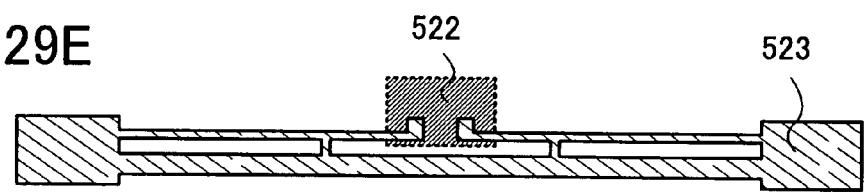

Alternatively, a layout shown in FIG. 29B a may be used in which the circuit element 522 having various circuits and the like is surrounded by the thin antenna 523. Further, a layout shown in FIG. 29C may be used in which the circuit element 522 having various circuits and the like is disposed, and the antenna 523 has a form suited to receiving high-frequency electromagnetic waves. Alternatively, a layout shown in FIG. 29D may be used in which the circuit element 522 having various circuits and the like is disposed, and the antenna 523 which is 180-degree omnidirectional (such that it can receive signals equally from any direction) is disposed. As a further alternative, a layout shown in FIG. 29E may be used in which the circuit element 522 having various circuits and the like is disposed, and the antenna 523 with a long rod shape is disposed. The internal antenna circuit 411 or the external antenna circuit 415 may be formed by combination of the antennas with the above-described shapes.

In FIGS. 29A to 29E, connection between the antenna 523 and the circuit element 522 having various circuits and the like is not specifically limited. For example, the antenna 523 and the circuit element 522 having various circuits and the like may be connected by wire bonding or bump bonding.

Alternatively, part of the circuit element 522 may be used as an electrode to be attached to the antenna 523. With this method, the circuit element 522 can be attached to the antenna 523 by use of an ACF (Anisotropic Conductive Film). In addition, the length required of the antenna 523 differs depending on the reception frequency. For example, on the assumption that a frequency of 2.45 GHz is used, in the case of providing a half-wave dipole antenna, the length of the antenna is preferably half the length of the wavelength (about 60 nm); in the case of providing a monopole antenna, the length of the antenna is preferably quarter the length of the wavelength (about 30 nm).

Figure 30:
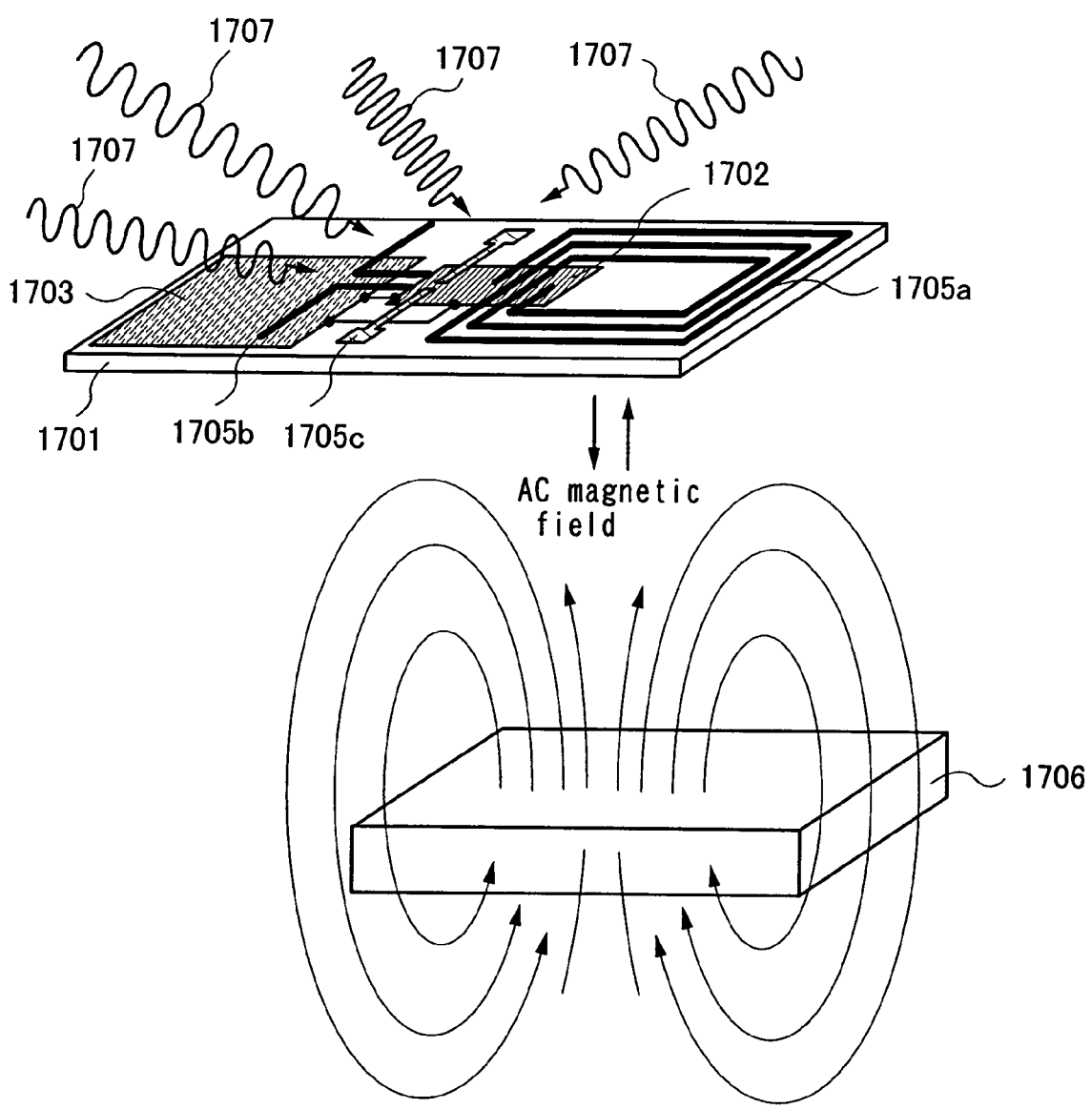
FIG. 30 illustrates a circuit included in a battery of the invention.

Note that the internal antenna circuit 411 may have a multiband antenna structure capable of receiving electromagnetic waves with a plurality of frequency bands. For example, as shown in FIG. 30, the internal antenna circuit may be constructed from a plurality of antenna circuits. In the structure shown in FIG. 30, a first antenna circuit 1705a, a second antenna circuit 1705b, a third antenna circuit 1705c, a circuit element 1702 having a control circuit, and a battery 1703 are provided over a substrate 1701. Note that the first antenna circuit 1705a, the second antenna circuit 1705b, and the third antenna circuit 1705c are electrically connected to the control circuit provided in the circuit element 1702. Note also that reference numeral 1706 denotes a transmitter for transmitting electromagnetic waves for charging the battery, and provided in a display portion or the like.

Electromagnetic waves received at the first antenna circuit 1705a, the second antenna circuit 1705b, and the third antenna circuit 1705c are input to the battery 1703 through the rectifier circuit in the control circuit formed in the circuit element 1702, so that the battery 1703 is charged.

Here, an example is shown in which the first antenna circuit 1705a receives electromagnetic waves transmitted from the transmitter 1706, whereas the second antenna circuit 1705b and the third antenna circuit 1705c receive external radio signals 1707. Connection relation between the first antenna circuit 1705a, the second antenna circuit 1705b, and the third antenna circuit 1705c is not specifically limited. For example, all of the antennas may be electrically connected or separately provided without electrical connection.

Note that the lengths and shapes of the first antenna circuit 1705a, the second antenna circuit 1705b, and the third antenna circuit 1705c that are used for charging the battery 1703 are not limited to those shown in FIG. 30. Although FIG. 30 illustrates the example where linear antennas (dipole antennas) with different lengths are used as the second antenna circuit 1705b and the third antenna circuit 1705c, the following combinations may also be employed: a dipole antenna and a coiled antenna, a dipole antenna and a patch antenna, and the like. In this manner, by provision of a plurality of antennas with different lengths or shapes as the antennas used for charging the battery 1703, various radio signals can be received. Therefore, charging efficiency can be improved. In particular, when antennas with different shapes, e.g., a patch antenna and a dipole antenna, are used in combination (such that a folding dipole antenna is disposed around a patch antenna), limited space can be effectively used. Although the battery illustrated in this embodiment mode includes the three antenna circuits 1705a, 1705b, and 1705c, the invention is not limited to this structure. It is also possible to provide one antenna circuit or more then three antenna circuits.

As exemplary signals communicated between the first antenna circuit 1705a and the transmitter 1706, signals with a frequency band of 125 kHz, 13.56 MHz, 915 MHz, 2.45 GHz, or the like which meets the ISO standards can be used. Needless to say, the frequency of signals communicated between the first antenna circuit 1705a and the transmitter 1706 is not limited to these, and for example, any of the following frequencies can be used: submillimeter waves of 300 GHz to 3 THz, millimeter waves of 30 GHz to 300 GHz, microwaves of 3 GHz to 30 GHz, a ultra high frequency of 300 MHz to 3 GHz, a very high frequency of 30 MHz to 300 MHz, a high frequency of 3 MHz to 30 MHz, a medium frequency of 300 kHz to 3 MHz, a low frequency of 30 kHz to 300 kHz, and a very low frequency of 3 kHz to 30 kHz. In addition, signals communicated between the first antenna circuit 1705a and the transmitter 1706 are signals obtained by carrier modulation. A carrier modulation method can be either analog modulation or digital modulation, and any of amplitude modulation, phase modulation, frequency modulation, and spread spectrum can be used. Preferably, amplitude modulation or frequency modulation is used.

In addition, as the external radio signals 1707 received at the second antenna circuit 1705b and the third antenna circuit 1705c, the following signals can be used: radio waves (e.g., 800 to 900 MHz, 1.5 GHz, or 1.9 to 2.1 GHz) from mobile-phone relay stations, radio waves radiated from mobile phones, radio waves (e.g., 40 kHz) of radio wave clocks, noise (e.g., 60 Hz) of domestic AC power supply, signals randomly emitted from other readers/writers, and the like. When the battery is wirelessly charged with radio signals received from outside, there is no need to use a separate charger and the like for charging the battery. Therefore, the battery can be fabricated at lower cost. Further, when a plurality of antenna circuits having antennas with different lengths or shapes are provided as shown in FIG. 30, it is possible to use various radio signals for charging the battery 1703. In addition, the antennas provided in the second antenna circuit 1705b and the third antenna circuit 1705c are preferably formed to have lengths and shapes that can receive the above-described radio signals with high sensitivity. In addition, although FIG. 30 illustrates the example where the first antenna circuit 1705a receives electromagnetic waves from the transmitter 1706, the invention is not limited to this, and a structure may be used in which all of the antenna circuits receive external radio signals for charging the battery.

Although FIG. 30 illustrates the example where the plurality of antenna circuits 1705a, 1705b, and 1705c, the circuit element 1702, and the battery 1703 are provided over the same substrate 1701, the invention is not limited to this structure. For example, the above-described components may be provided over different substrates.

Next, a thin-film battery will be described as a configuration example of the battery 407 shown in FIG. 27. In this embodiment mode, a configuration example of a battery in the case of using a thin lithium ion battery is described with reference to FIG. 31.

Figure 31:
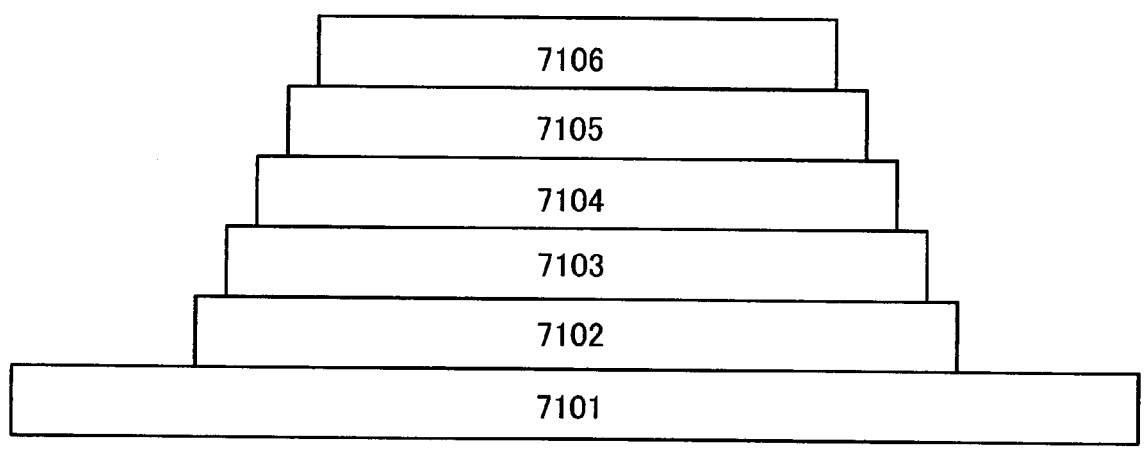
FIG. 31 is a cross-sectional view of a battery of the invention.

FIG. 31 illustrates a schematic cross section of a thin-film battery. First, a current-collecting thin film 7102 to serve as an electrode is formed over a substrate 7101. The current-collecting thin film 7102 should have high adhesion to an upper negative electrode active material layer 7103 and have low resistance. For example, aluminum, copper, nickel, vanadium, or the like can be used. Next, the negative electrode active material layer 7103 is formed over the current-collecting thin film 7102. Generally, vanadium oxide ($V_2O_5$) or the like is used. Next, a solid electrolyte layer 7104 is formed over the negative electrode active material layer 7103. Generally, lithium phosphate ($Li_3PO_4$) or the like is used. Next, a positive electrode active material layer 7105 is formed over the solid electrolyte layer 7104. Generally, lithium manganate ($LiMn_2O_4$) or the like is used. Lithium cobaltate ($LiCoO_2$) or lithium nickel oxide ($LiNiO_2$) can also be used. Next, a current-collecting thin film 7106 to serve as an electrode is formed over the positive electrode active material layer 7105. The current-collecting thin film 7106 should have high adhesion to the positive electrode active material layer 7105 and have low resistance. For example, aluminum, copper, nickel, vanadium, or the like can be used. Note that lithium ion batteries are advantageous over nickel-cadmium batteries, lead batteries, and the like in that they have no memory effects and can discharge a large amount of current.

Each of the above-described thin layers of the current-collecting thin film 7102, the negative electrode active material layer 7103, the solid electrolyte layer 7104, the positive electrode active material layer 7105, and the current-collecting thin film 7106 may be formed by using a sputtering technique or an evaporation technique. In addition, each of the current-collecting thin film 7102, the negative electrode active material layer 7103, the solid electrolyte layer 7104, the positive electrode active material layer 7105, and the current-collecting thin film 7106 preferably has a thickness of 0.1 to 3 μm.

Next, charging and discharging operations will be described. In charging the battery, lithium ions are desorbed from the positive electrode active material layer 7105. Then, the lithium ions are absorbed into the negative electrode active material layer 7103 through the solid electrolyte layer 7104. At this time, electrons are released to outside from the positive electrode active material layer 7105.

In discharging the battery, on the other hand, lithium ions are desorbed from the negative electrode active material layer 7103. Then, the lithium ions are absorbed into the positive electrode active material layer 7105 through the solid electrolyte layer 7104. At this time, electrons are released to outside from the negative electrode active material layer 7103. The thin-film secondary battery operates in this manner.

Note that it is preferable to stack another set of thin layers of the current-collecting thin film 7102, the negative electrode active material layer 7103, the solid electrolyte layer 7104, the positive electrode active material layer 7105, and the current-collecting thin film 7106, whereby higher electricity can be stored in or released from the battery.

The battery shown in this embodiment mode has a thin-film form with a thickness of about 10 μm or less, and is chargeable and dischargeable. Therefore, using the battery in this embodiment mode can fabricate a compact and lightweight semiconductor device.

Figure 32:
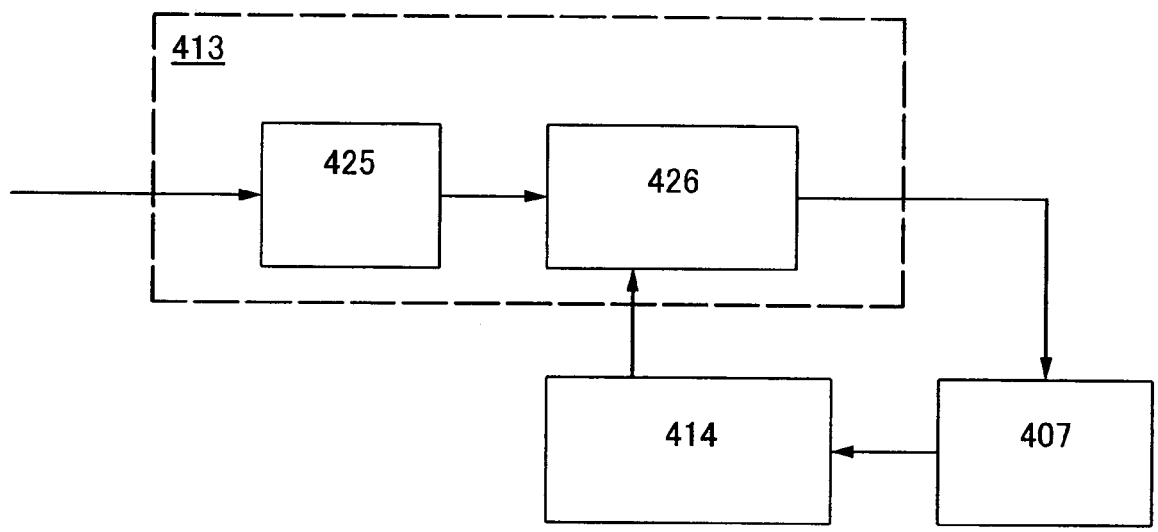
FIG. 32 is a block diagram illustrating a circuit included in a battery of the invention.

When using a battery that is chargeable and dischargeable, it is generally necessary to control the charging and discharging of the battery. That is, it is necessary to charge the battery while at the same time monitoring the charged level of the battery in order to prevent overcharging. A charging control circuit in this embodiment mode will now be described. FIG. 32 is a block diagram of the charging circuit 413, the charging control circuit 414, and the battery 407 shown in FIG. 27.

The charging circuit 413 illustrated in FIG. 32 includes a constant current source circuit 425 and a switch circuit 426, and is electrically connected to the charging control circuit 414 and the battery 407. Note that the charging circuit shown in FIG. 32 is only exemplary. Therefore, the invention is not limited to this structure and other structures may also be used. Although the battery 407 is charged with a constant current in this embodiment mode, a power source may be switched to a constant voltage source at a certain point. In addition, another method without using a constant current may also be employed. Further, transistors included in the circuit described below may be any of thin film transistors, transistors on a single-crystalline substrate, and organic transistors.

Figure 33:
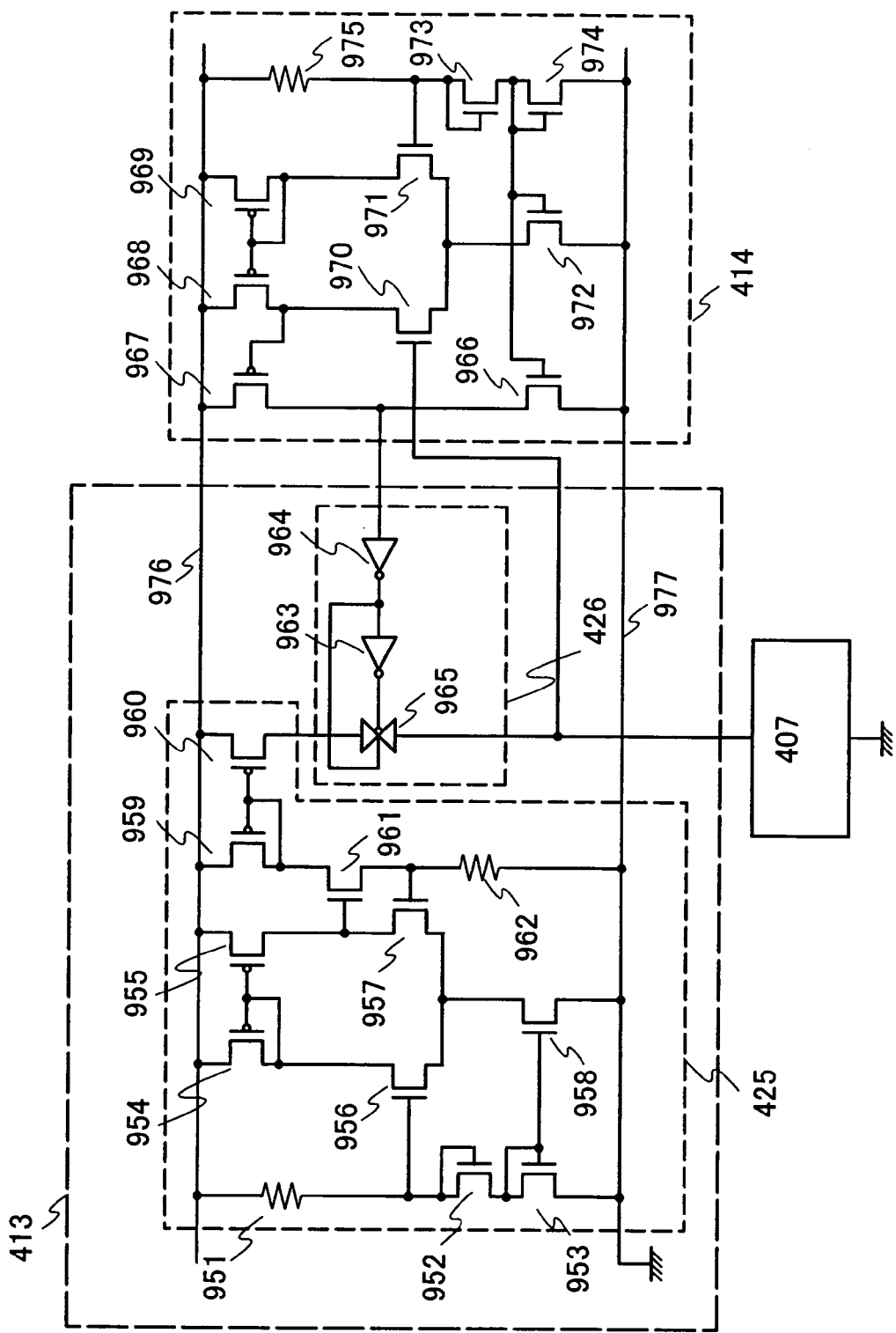
FIG. 33 illustrates a circuit included in a battery of the invention.

FIG. 33 is a detailed diagram of FIG. 32. The operation of the circuit will be described below. The constant current source circuit 425, the switch circuit 426, and the charging control circuit 414 use a high-potential power supply line 976 and a low-potential power supply line 977 as power supply lines. Although the low-potential power supply line 977 is used as a GND line in FIG. 33, the low-potential power supply line 977 may have a different potential without limitation to GND.

The constant current source circuit 425 includes transistors 952 to 961 and resistors 951 and 962. A current flows into the transistors 952 and 953 from the high-potential power supply line 976 through the resistor 951, so that the transistors 952 and 953 are turned on.

The transistors 954 to 958 constitute a feedback differential amplifier, and the gate potential of the transistor 952 is about the same level as the gate potential of the transistor 956. The drain current of the transistor 961 has a value obtained by dividing a potential difference between the gate potential of the transistor 957 and the potential of the low-potential power supply line 977 by the resistance value of the resistor 962. The drain current is input into the current mirror circuit constructed from the transistors 959 and 960, and an output current of the current mirror circuit is supplied to the switch circuit 426. The constant current source circuit 425 is not limited to this structure and a different structure may also be used.

The switch circuit 426 includes a transmission gate 965 and inverters 963 and 964. The input signal of the inverter 964 controls whether or not to supply a current to the battery 407 from the constant current source circuit 425. The switch circuit is not limited to this structure and a different structure may also be used.

The charging control circuit 414 includes transistors 966 to 974 and a resistor 975. A current flows into the transistors 973 and 974 from the high-potential power supply line 976 through the resistor 975, so that the transistors 973 and 974 are turned on. The transistors 968 to 972 constitute a differential comparator. When the gate potential of the transistor 970 is lower than the gate potential of the transistor 971, the drain potential of the transistor 968 has about the same level as the potential of the high-potential power supply line 976, whereas when the gate potential of the transistor 970 is higher than the gate potential of the transistor 971, the drain potential of the transistor 968 is about the same level as the source potential of the transistor 970.

When the drain potential of the transistor 968 is about the same level as the potential of the high-potential power supply line 976, the charging control circuit 414 outputs a low signal through a buffer constructed from the transistors 967 and 966. When the drain potential of the transistor 968 is about the same level as the source potential of the transistor 970, the charging control circuit 414 outputs a high signal through the buffer constructed from the transistors 967 and 966.

When the output of the charging control circuit 414 is low, a current is supplied to the battery 407 through the switch circuit 426. On the other hand, when the output of the charging control circuit 414 is high, the switch circuit 426 is turned off and no current is supplied to the battery 407. A gate of the transistor 970 is electrically connected to the battery 407; therefore, when the battery has been charged and the potential of the battery has surpassed the threshold voltage of the comparator of the charging control circuit 414, charging stops. Although the threshold voltage of the comparator is set at the gate potential of the transistor 973 in this embodiment mode, the threshold voltage is not limited to this value, and may be a different potential. Such potential is generally determined in accordance with the intended use of the device and the performance of the battery. Note that the configuration of the charging circuit of the battery is not limited to this structure.

Embodiment Mode 5

This embodiment mode will describe examples of various electronic devices which include photoelectric conversion devices in accordance with the invention. Examples of electronic devices to which the invention is applied include computers, displays, mobile phones, television sets, and the like. Specific examples of such electronic devices are shown in FIGS. 19 through 23B.

Figure 19:
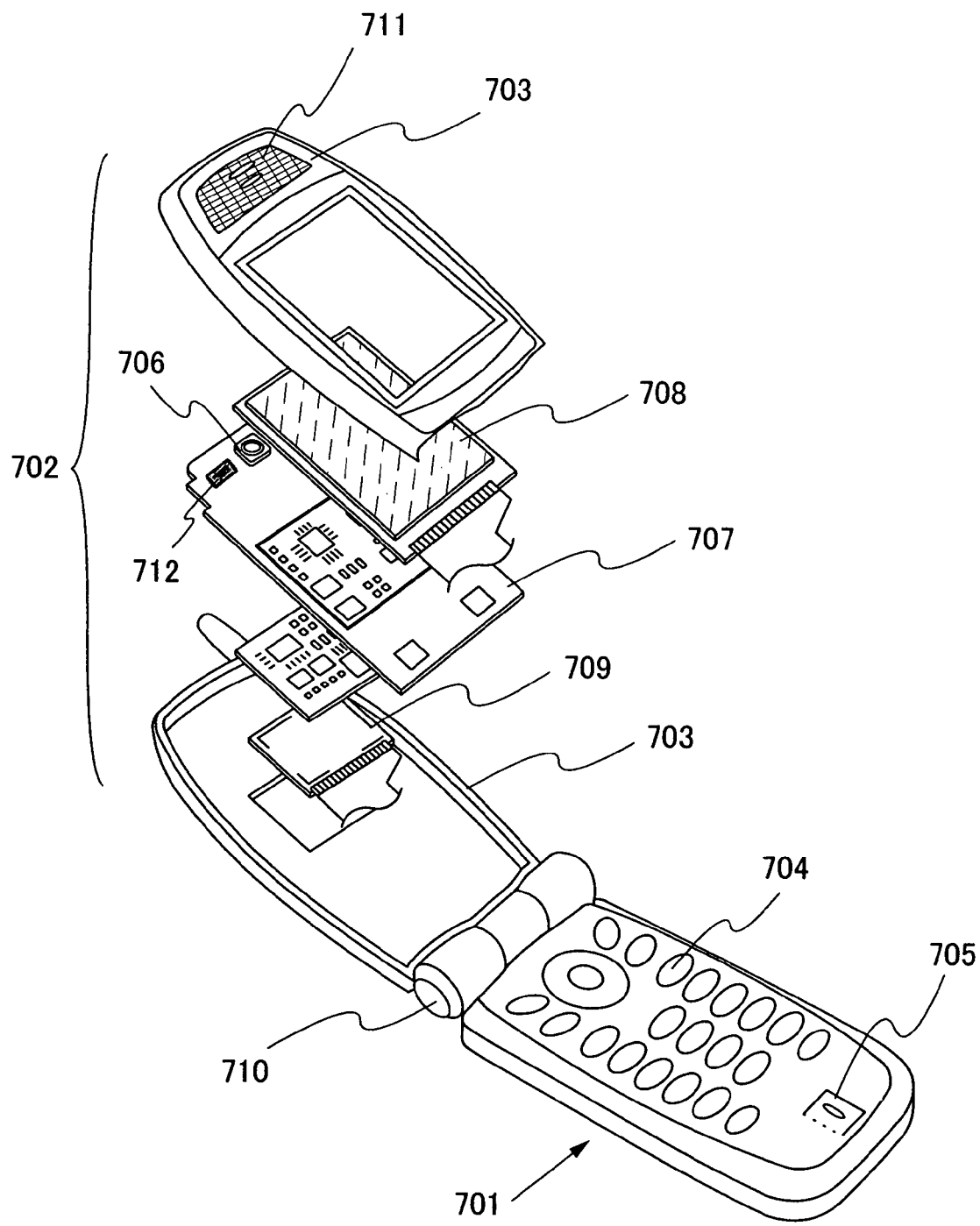
FIG. 19 illustrates a device having a semiconductor device of the invention.

FIG. 19 illustrates a mobile phone which includes a main body (A) 701, a main body (B) 702, a housing 703, operation keys 704, an audio input portion 705, an audio output portion 706, a circuit board 707, a display panel (A) 708, a display panel (B) 709, a hinge 710, a light-transmitting material portion 711, and a photoelectric conversion element 712. The invention can be applied to the photoelectric conversion element 712.

The photoelectric conversion element 712 detects light that has passed through the light-transmitting material portion 711, and controls the luminance of the display panel (A) 708 and the display panel (B) 709 as well as controlling the lighting of the operation keys 704 in accordance with the illuminance of outside light that has been detected by the photoelectric conversion element 712. Accordingly, power consumption of the mobile phone can be suppressed.

Figure 20A:
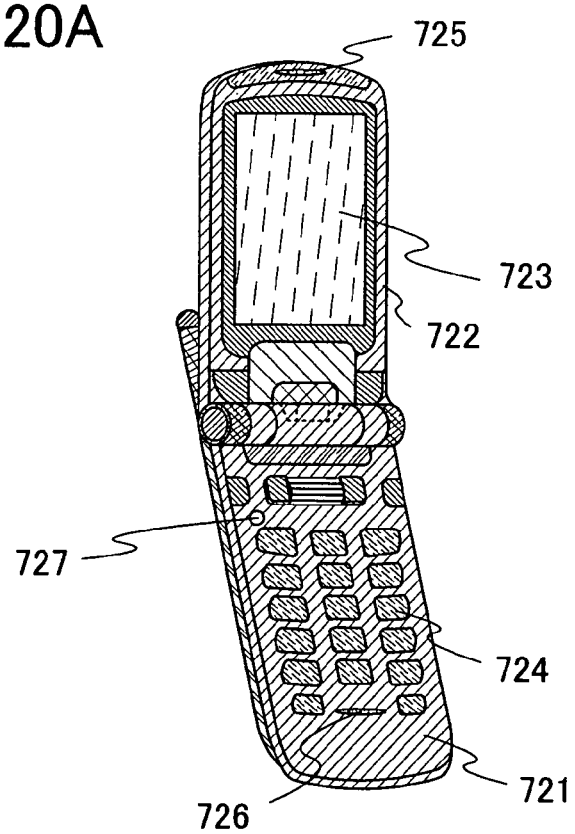
FIGS. 20A and 20B illustrate devices each having a semiconductor device of the invention.
Figure 20B:
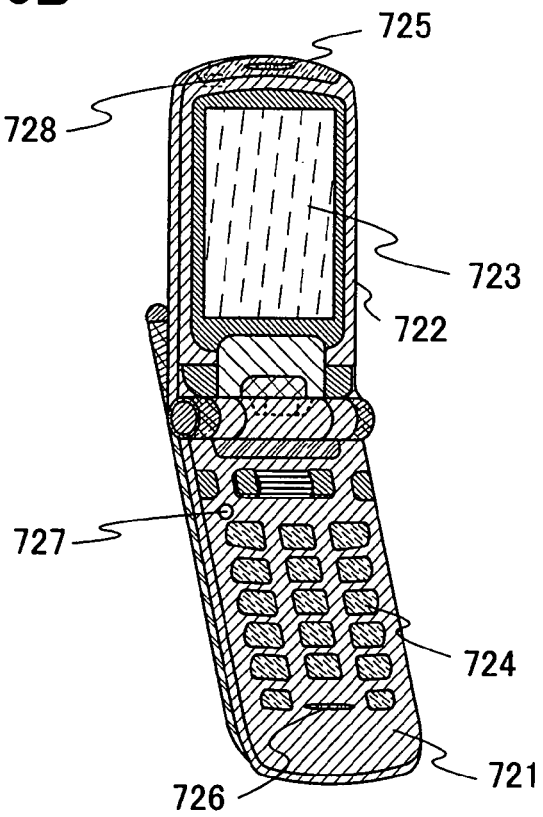

FIGS. 20A and 20B illustrate other examples of mobile phones. In FIGS. 20A and 20B, reference numeral 721 denotes a main body, reference numeral 722 denotes a housing, reference numeral 723 denotes a display panel, reference numeral 724 denotes operation keys, reference numeral 725 denotes an audio output portion, reference numeral 726 denotes an audio input portion, and reference numerals 727 and 728 denote photoelectric conversion elements.

In the mobile phone shown in FIG. 20A, luminance of the display panel 723 and the operation keys 724 can be controlled by detecting outside light with the photoelectric conversion element 727 provided in the main body 721.

In the mobile phone shown in FIG. 20B, the photoelectric conversion element 728 is provided inside the main body 721 in addition to the structure of FIG. 20A. With the photoelectric conversion element 728, luminance of a backlight provided in the display panel 723 can also be detected.

Figure 21A:
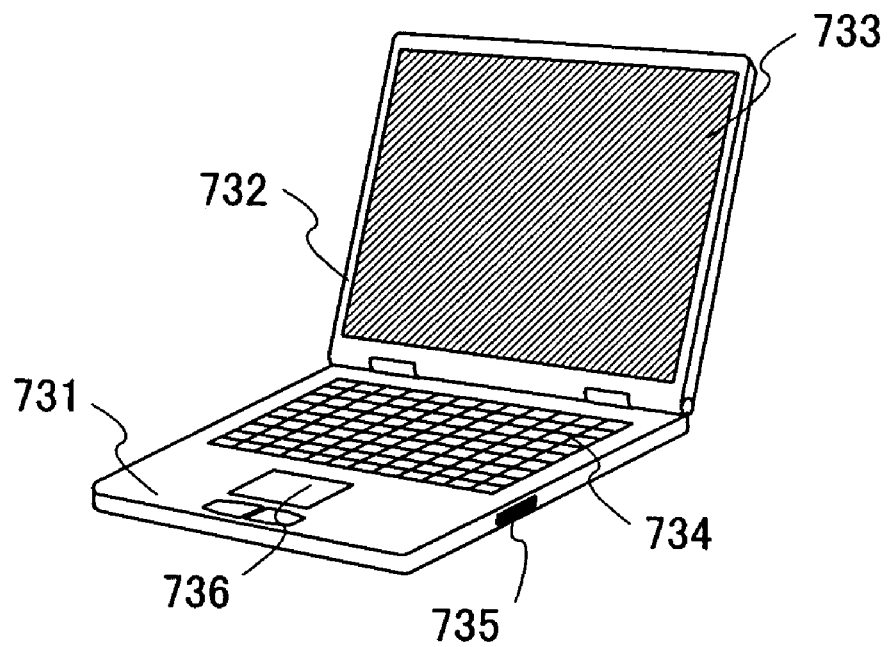
FIGS. 21A and 21B illustrate devices each having a semiconductor device of the invention.

FIG. 21A illustrates a computer which includes a main body 731, a housing 732, a display portion 733, a keyboard 734, an external connection port 735, a pointing device 736, and the like.

Figure 21B:
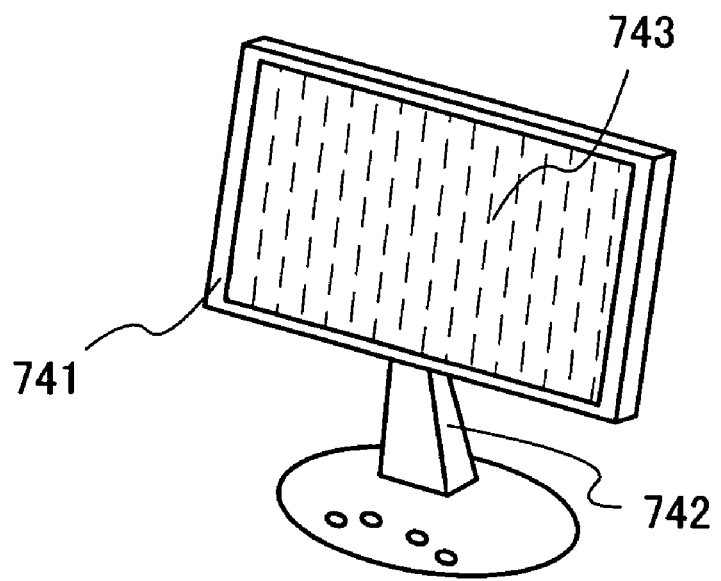

FIG. 21B illustrates a display device which corresponds to a television receiver for example. The display device includes a housing 741, a supporting base 742, a display portion 743, and the like.

Figure 22:
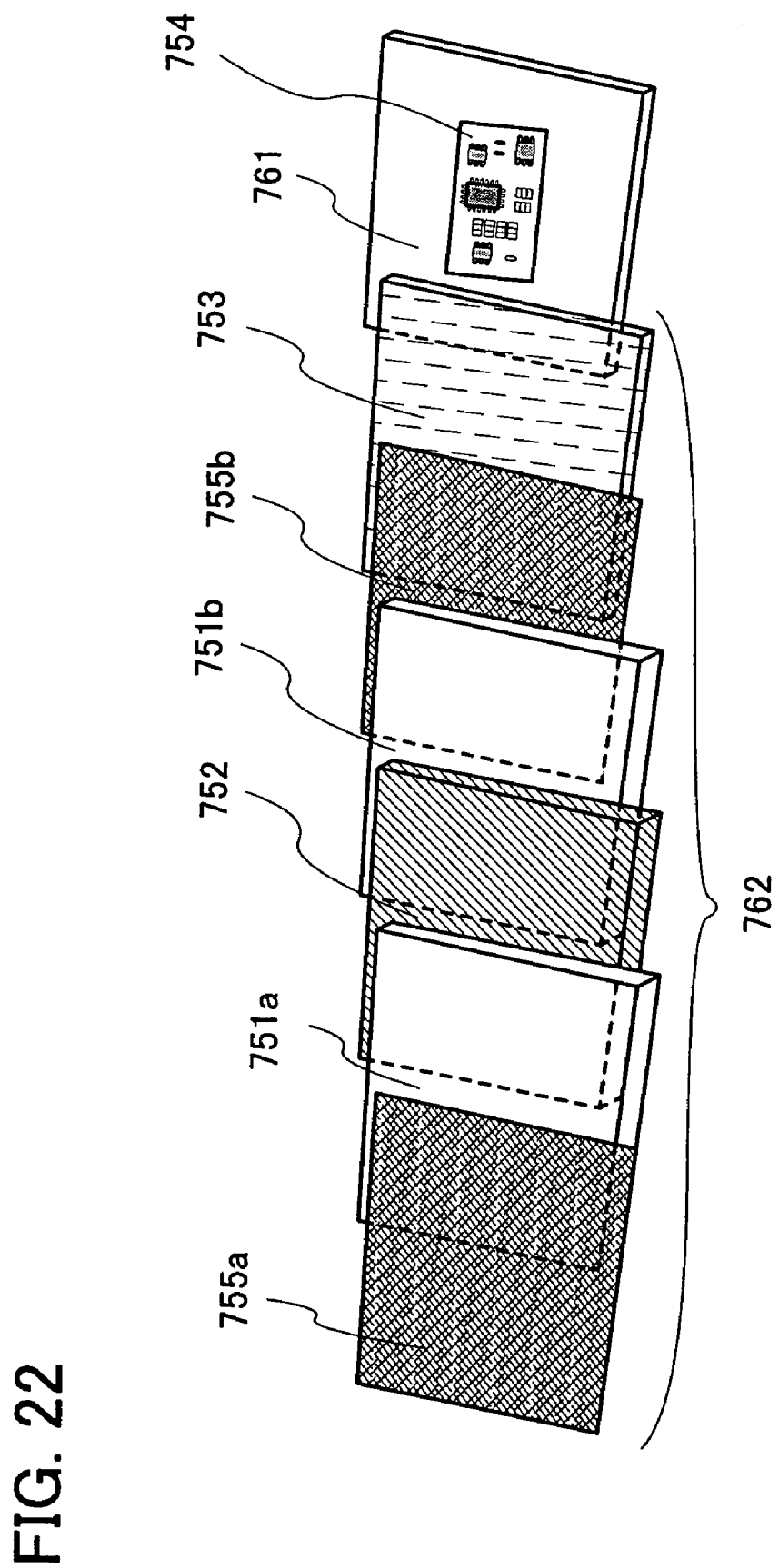
FIG. 22 illustrates a device having a semiconductor device of the invention.

FIG. 22 illustrates a specific configuration where a liquid crystal panel is used as the display portion 733 provided in the computer shown in FIG. 21A and the display portion 743 of the display device shown in FIG. 21B.

A liquid crystal panel 762 shown in FIG. 22 is built into a housing 761, and includes substrates 751a and 751b, a liquid crystal layer 752 sandwiched therebetween, polarization filters 755a and 755b, a backlight 753, and the like. In the housing 761, a photoelectric conversion element formation region 754 having a photoelectric conversion element is formed.

The photoelectric conversion element formation region 754 fabricated in accordance with the invention detects the amount of light from the backlight 753, the data of which is fed back to control the luminance of the liquid crystal panel 762.

Figure 23A:
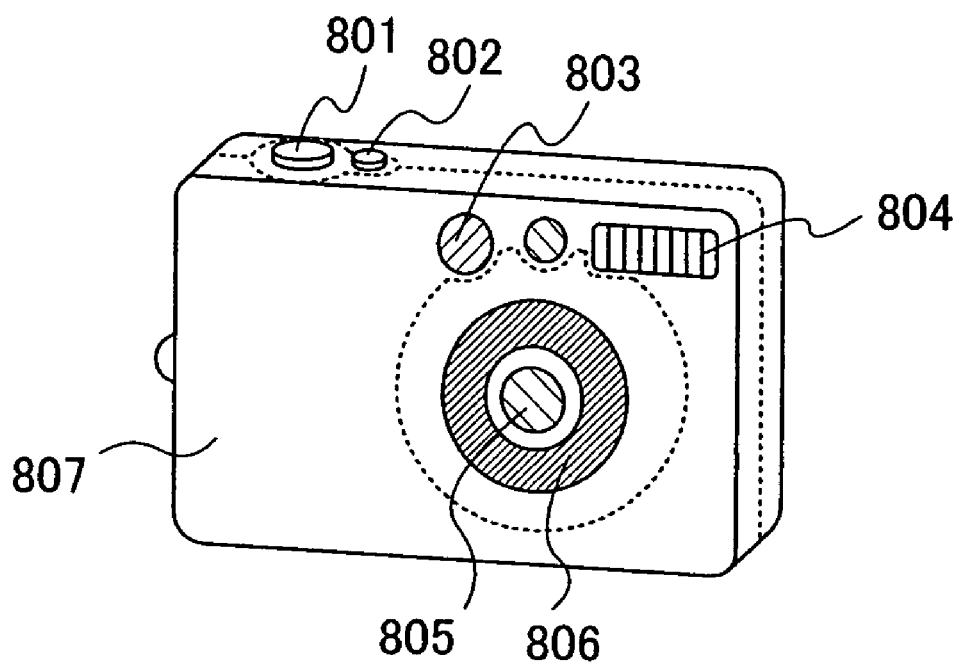
FIGS. 23A and 23B illustrate a device having a semiconductor device of the invention.
Figure 23B:
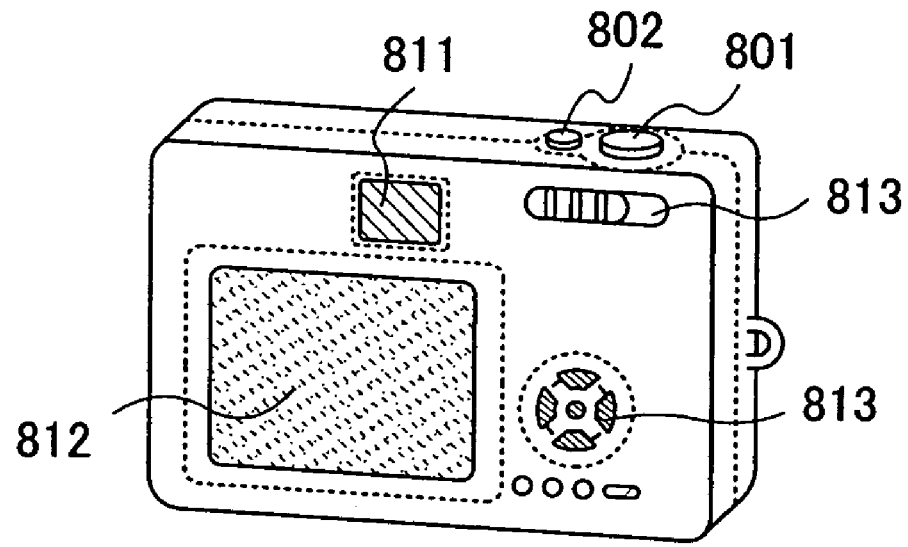

FIGS. 23A and 23B illustrate an example where a photosensor of the invention is built into a camera, e.g., a digital camera. FIG. 23A is a perspective view of the digital camera seen from the front side, and FIG. 23B is a perspective view thereof seen from the rear side. Referring to FIG. 23A, the digital camera is provided with a release button 801, a main switch 802, a viewfinder 803, a flash portion 804, a lens 805, a barrel 806, and a housing 807.

Referring to FIG. 23B, the digital camera is also provided with a viewfinder eyepiece 811, a monitor 812, and operation buttons 813.

When the release button 801 is pushed down to the half point, a focus adjustment mechanism and an exposure adjustment mechanism are activated. When the release button is pushed down to the lowest point, a shutter opens.

By pushing down or rotating the main switch 802, power of the digital camera is switched on or off.

The viewfinder 803 is located above the lens 805 on the front side of the digital camera, for checking the shooting range and the focus point from the viewfinder eyepiece 811 shown in FIG. 23B.

The flash portion 804 is located in the upper portion of the front side of the digital camera. When the luminance of the photographic subject is not enough, the release button may be pushed down to open the shutter and deliver auxiliary light from the flash portion 804.

The lens 805 is located at the front side of the digital camera and includes a focusing lens, a zoom lens, and the like. This lens, in conjunction with a shutter and a diaphragm (not shown), constitutes an imaging optical system. Behind the lens, an imaging device such as a CCD (Charge Coupled Device) is provided.

The barrel 806 moves the position of the lens to adjust the focus of the focusing lens, the zoom lens, and the like. In shooting, the barrel is slid out to move the lens 805 forward. When carrying the digital camera, the lens 805 is moved backward to be compact. Note that a structure is employed in this embodiment mode in which the photographic subject can be zoomed and shot by sliding out the barrel; however, the invention is not limited to this structure. For example, a digital camera may be constructed which can zoom and shoot the photographic subject without sliding out the barrel with the use of the imaging optical system inside the housing 807.

The viewfinder eyepiece 811 is located in the upper portion of the rear side of the digital camera for looking therethrough in checking the shooting range and the focus point.

The operation buttons 813 are buttons with various functions provided on the rear side of the digital camera, which include a setup button, a menu button, a display button, a function button, a selection button, and the like.

When a photosensor of the invention is built into the camera shown in FIGS. 23A and 23B, presence and intensity of outside light can be detected with the photosensor; thus, exposure adjustment and the like of the camera can be performed.

In addition, a photosensor of the invention can also be applied to other electronic devices such as a projection TV and a navigation system. That is, the photosensor of the invention can be applied to any object which needs to detect light.

Note that this embodiment mode can be combined with other embodiment modes as required.

Embodiment 1

Figure 24:
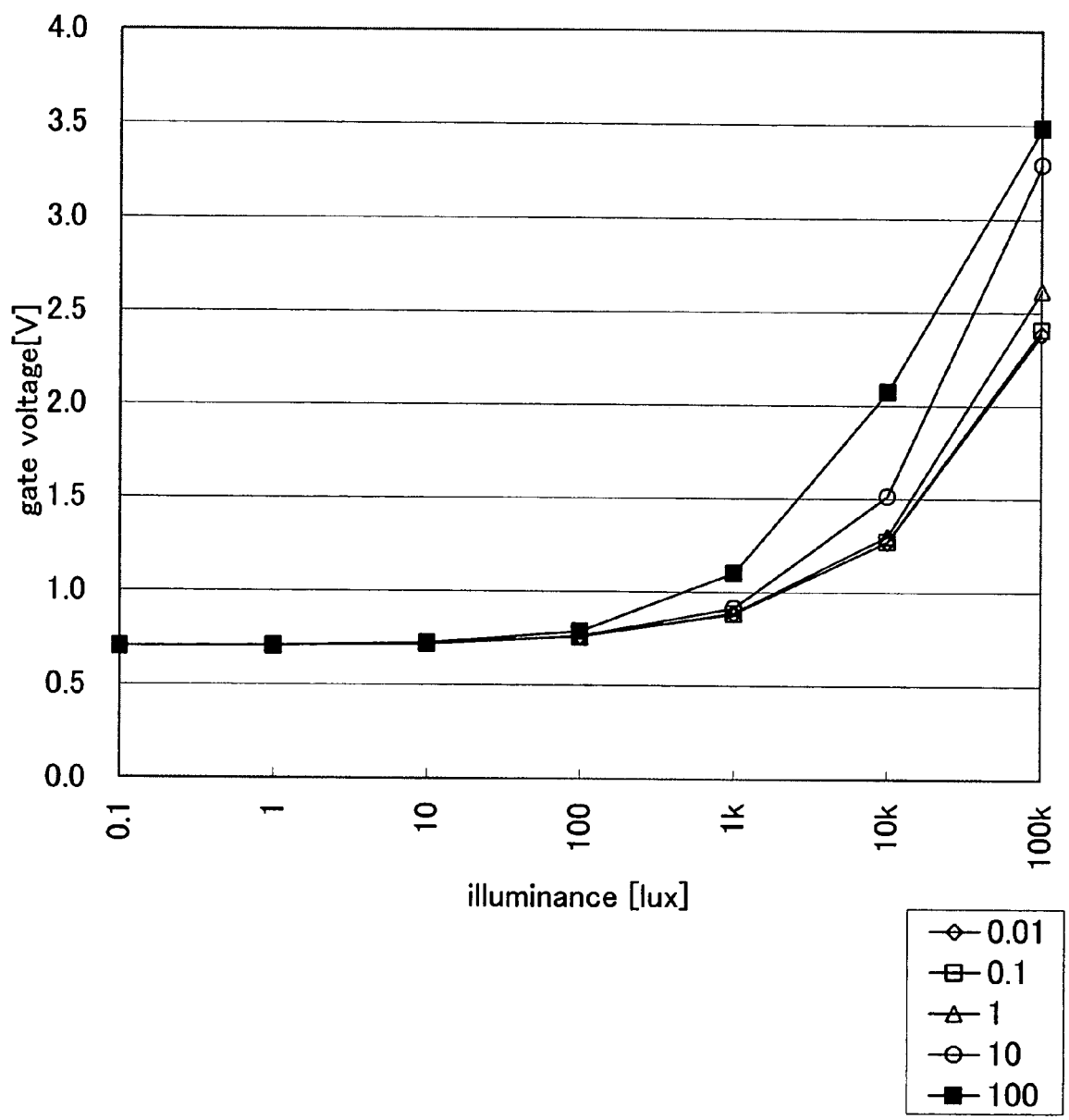
FIG. 24 illustrates the relationship between the illuminance E and the photocurrent I when the thickness of a conductive film which forms a source or drain electrode is varied.
Figure 25:
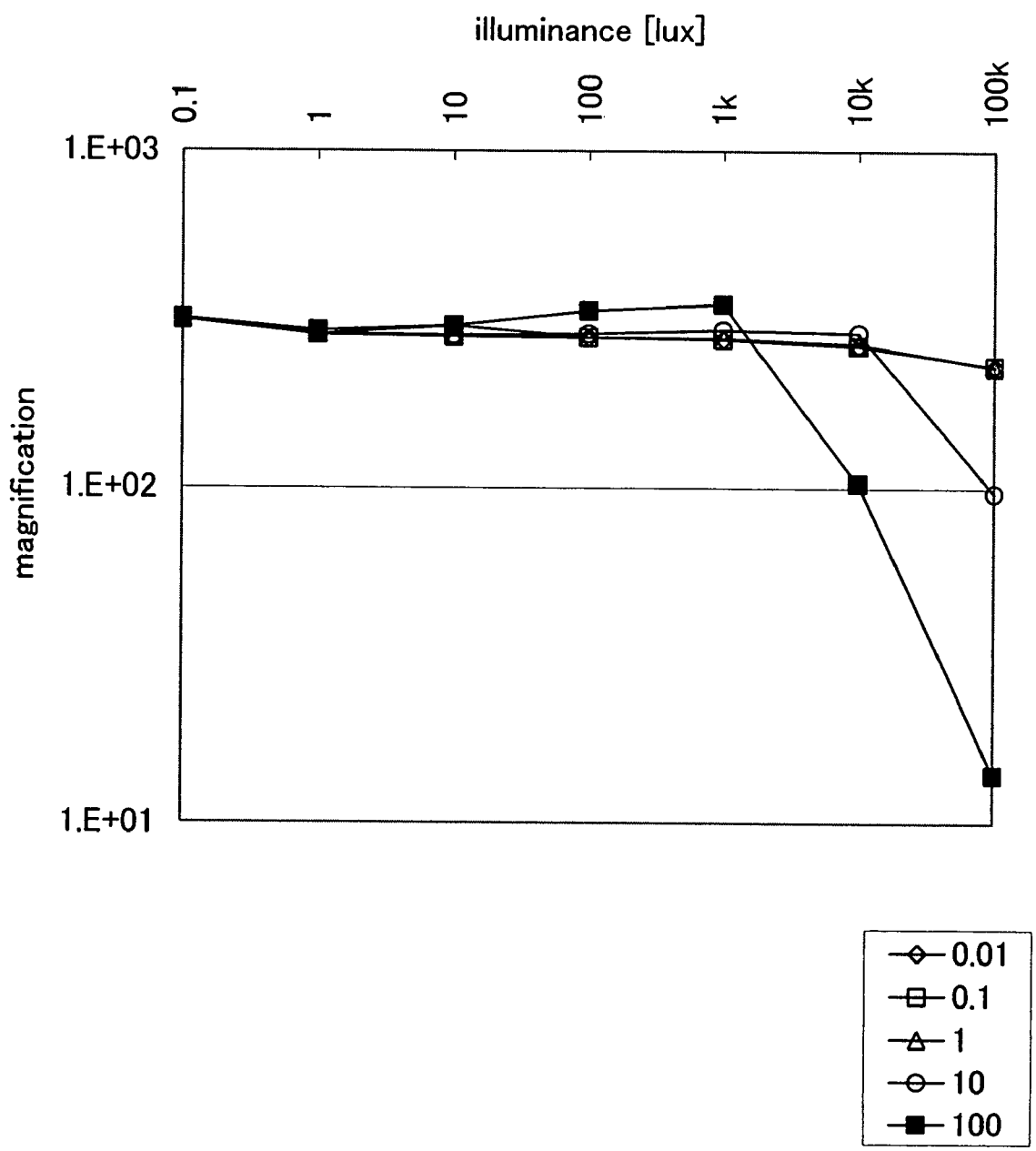
FIG. 25 illustrates the relationship between the illuminance E and the magnification when the thickness of a conductive film which forms a source or drain electrode is varied.

This embodiment will describe the relationship between the illuminance E and the photocurrent I when the thickness of a conductive film which forms a source or drain electrode of the TFT 104 in FIG. 1 is varied, with reference to FIGS. 24 and 25.

FIG. 24 illustrates the relationship between the illuminance E (horizontal axis) and the gate voltage $V_{gate}$ (vertical axis), where the thickness of the source or drain electrode is formed to satisfy the following sheet resistance values: 0.052 Ω/□, 0.52 Ω/□, 5.2 Ω/□, 52 Ω/□, and 520 Ω/□ (resistance ratio of 0.01:0.1:1:10:100).

FIG. 25 illustrates the relationship between the illuminance E (horizontal axis) and the magnification (vertical axis), where the magnification indicates the derivative value of the photocurrent I in FIG. 24.

Note that in FIGS. 24 and 25, hollow rhomboids represent the sheet resistance ratio of 0.01 (the sheet resistance of 0.052 Ω/□), hollow quadrangles represent the sheet resistance ratio of 0.1 (the sheet resistance of 0.52 Ω/□), hollow triangles represent the sheet resistance ratio of 1 (the sheet resistance of 5.2 Ω/□), hollow circles represent the sheet resistance ratio of 10 (the sheet resistance of 52 Ω/□), and solid quadrangles represent the sheet resistance ratio of 100 (the sheet resistance of 520 Ω/□).

As can be seen from FIGS. 24 and 25, at the sheet resistance values of 0.052 Ω/□, 0.52 Ω/□, and 5.2 Ω/□ (the resistance ratio of 0.01, 0.1, and 1) where the resistance value of the source or drain electrode is low, the reduction rate of photocurrent I is low even when the illuminance E is increased. On the other hand, at the sheet resistance values of 52 Ω/□ and 520 Ω/□ (the resistance ratio of 10 and 100) where the resistance value of the source or drain electrode is high, the photocurrent I decreases significantly with the increase in illuminance E.

The above result shows that the output photocurrent decreases by the generation of parasitic resistance in the reference TFT 104 of the current mirror circuit. This could result in a decrease in detectable range of light intensity. Thus, the structure of the invention is advantageous in suppressing generation of parasitic resistance and preventing a decrease in photosensitivity.

According to the invention, a semiconductor device and photoelectric conversion device in which a decrease in photosensitivity can be suppressed can be fabricated. Further, when the semiconductor device or photoelectric conversion device of the invention is built into an electric device, stable circuit operation and high reliability can be ensured.

The present application is based on Japanese Priority application No. 2006-268854 filed on Sep. 29, 2006 with the Japanese Patent Office, the entire contents of which are hereby incorporated by reference.

What is claimed is:

1. A semiconductor device comprising:
   a photoelectric conversion element having a square plane;
   a current mirror circuit including a reference thin film transistor and a plurality of output thin film transistors, the current mirror circuit amplifying an output of the photoelectric conversion element;
   a high-potential electrode arranged at a first side of the photoelectric conversion element; and
   a low-potential electrode arranged at a second side of the photoelectric conversion element;

wherein both the reference thin film transistor and the plurality of output thin film transistors are n-type thin film transistors, wherein one of source and drain electrodes of the reference thin film transistor is electrically connected to the high-potential electrode through the photoelectric conversion element, wherein one of source and drain electrodes of each of the plurality of output thin film transistors is electrically connected to the high-potential electrode, wherein the other of the source and drain electrodes of the reference thin film transistor is electrically connected to the low-potential electrode, wherein the other of the source and drain electrodes of each of the plurality of output thin film transistors is electrically connected to the low-potential electrode, wherein the plurality of output thin film transistors are provided in an L-shape region extending from a vicinity of the high-potential electrode to a vicinity of the low-potential electrode along the first side and the second side, and wherein the reference thin film transistor is provided in the vicinity of the low-potential electrode.

2. The semiconductor device according to claim 1, wherein a drop in gate voltage of the reference thin film transistor is suppressed.

3. The semiconductor device according to claim 1, wherein a gate electrode of each of the plurality of output thin film transistors is electrically connected to a gate electrode and the one of the source and drain electrodes of the reference thin film transistor, wherein the one of the source and drain electrodes of the reference thin film transistor is electrically connected to the one of the source and drain electrodes of each of the plurality of output thin film transistors through the photoelectric conversion element, and wherein the other of the source and drain electrodes of the reference thin film transistor is electrically connected to the other of the source and drain electrodes of each of the plurality of output thin film transistors.

4. A semiconductor device comprising:
a photoelectric conversion element having a square plane;
a current mirror circuit including a reference thin film transistor and a plurality of output thin film transistors, the current mirror circuit amplifying an output of the photoelectric conversion element;
a high-potential electrode arranged at a first side of the photoelectric conversion element; and
a low-potential electrode arranged at a second side of the photoelectric conversion element;
wherein both the reference thin film transistor and the plurality of output thin film transistors are n-type thin film transistors,
wherein one of source and drain electrodes of the reference thin film transistor is electrically connected to the high-potential electrode through the photoelectric conversion element,
wherein one of source and drain electrodes of each of the plurality of output thin film transistors is electrically connected to the high-potential electrode,
wherein the other of the source and drain electrodes of the reference thin film transistor is electrically connected to the low-potential electrode,
wherein the other of the source and drain electrodes of each of the plurality of output thin film transistors is electrically connected to the low-potential electrode, wherein a current path between the reference thin film transistor and the low-potential electrode is shorter than a current path between each of the plurality of output thin film transistors and the low-potential electrode, wherein the plurality of output thin film transistors are provided in an L-shape region extending from a vicinity of the high-potential electrode to a vicinity of the low-potential electrode along the first side and the second side, and wherein the reference thin film transistor is provided in the vicinity of the low-potential electrode.

5. The semiconductor device according to claim 4, wherein a drop in gate voltage of the reference thin film transistor is suppressed.

6. The semiconductor device according to claim 4, wherein a gate electrode of each of the plurality of output thin film transistors is electrically connected to a gate electrode and the one of the source and drain electrodes of the reference thin film transistor, wherein the one of the source and drain electrodes of the reference thin film transistor is electrically connected to the one of the source and drain electrodes of each of the plurality of output thin film transistors through the photoelectric conversion element, and wherein the other of the source and drain electrodes of the reference thin film transistor is electrically connected to the other of the source and drain electrodes of each of the plurality of output thin film transistors.

7. A semiconductor device comprising:
a photoelectric conversion element having a square plane;
a current mirror circuit including a reference thin film transistor and a plurality of output thin film transistors, the current mirror circuit amplifying an output of the photoelectric conversion element;
a high-potential electrode arranged at a first side of the photoelectric conversion element;
a low-potential electrode arranged at a second side of the photoelectric conversion element;
a battery electrically connected to the high-potential electrode and the low-potential electrode;
an antenna for receiving a signal;
a rectifier circuit for rectifying the signal received at the antenna; and
a charging circuit for charging the battery based on an output of the rectifier circuit,
wherein both the reference thin film transistor and the plurality of output thin film transistors are n-type thin film transistors,
wherein one of source and drain electrodes of the reference thin film transistor is electrically connected to the high-potential electrode through the photoelectric conversion element,
wherein one of source and drain electrodes of each of the plurality of output thin film transistors are electrically connected to the high-potential electrode,
wherein the other of the source and drain electrodes of the reference thin film transistor is electrically connected to the low-potential electrode,
wherein the other of the source and drain electrodes of each of the plurality of output thin film transistors are electrically connected to the low-potential electrode,
wherein the plurality of output thin film transistors are provided in an L-shape region extending from a vicinity of the high-potential electrode to a vicinity of the low-potential electrode along the first side and the second side, and wherein the reference thin film transistor is provided in the vicinity of the low-potential electrode.

8. The semiconductor device according to claim 7,
wherein a drop in gate voltage of the reference thin film transistor is suppressed.

9. The semiconductor device according to claim 7,
wherein a gate electrode of each of the plurality of output thin film transistors is electrically connected to a gate electrode and the one of the source and drain electrodes of the reference thin film transistor,
wherein the one of the source and drain electrodes of the reference thin film transistor is electrically connected to the one of the source and drain electrodes of each of the plurality of output thin film transistors through the photoelectric conversion element, and
wherein the other of the source and drain electrodes of the reference thin film transistor is electrically connected to the other of the source and drain electrodes of each of the plurality of output thin film transistors.

10. A semiconductor device comprising:
a photoelectric conversion element having a square plane;
a current mirror circuit including a reference thin film transistor and a plurality of output thin film transistors, the current mirror circuit amplifying an output of the photoelectric conversion element;
a high-potential electrode arranged at a first side of the photoelectric conversion element;
a low-potential electrode arranged at a second side of the photoelectric conversion element;
a battery electrically connected to the high-potential electrode and the low-potential electrode;
an antenna for receiving a signal;
a rectifier circuit for rectifying the signal received at the antenna; and
a charging circuit for charging the battery based on an output of the rectifier circuit,
wherein both the reference thin film transistor and the plurality of output thin film transistors are n-type thin film transistors,
wherein one of source and drain electrodes of the reference thin film transistor is electrically connected to the high-potential electrode through the photoelectric conversion element,
wherein one of source and drain electrodes of each of the plurality of output thin film transistors are electrically connected to the high-potential electrode,
wherein the other of the source and drain electrodes of the reference thin film transistor is electrically connected to the low-potential electrode,
wherein the other of the source and drain electrodes of each of the plurality of output thin film transistors are electrically connected to the low-potential electrode,
wherein a current path between the reference thin film transistor and the low-potential electrode is shorter than a current path between each of the plurality of output thin film transistors and the low-potential electrode,
wherein the plurality of output thin film transistors are provided in an L-shape region extending from a vicinity of the high-potential electrode to a vicinity of the low-potential electrode along the first side and the second side, and
wherein the reference thin film transistor is provided in the vicinity of the low-potential electrode.

11. The semiconductor device according to claim 10,
wherein a drop in gate voltage of the reference thin film transistor is suppressed.

12. The semiconductor device according to claim 10,
wherein a gate electrode of each of the plurality of output thin film transistors are electrically connected to a gate electrode and the one of the source and drain electrodes of the reference thin film transistor,
wherein the one of the source and drain electrodes of the reference thin film transistor is electrically connected to the one of the source and drain electrodes of the plurality of output thin film transistors through the photoelectric conversion element, and
wherein the other of the source and drain electrodes of the reference thin film transistor is electrically connected to the other of the source and drain electrodes of the plurality of output thin film transistors.

* * * * *